(12) United States Patent
Hsu et al.

(10) Patent No.: US 9,588,438 B2
(45) Date of Patent: Mar. 7, 2017

(54) OPTIMIZATION FLOWS OF SOURCE, MASK AND PROJECTION OPTICS

(75) Inventors: Duan-Fu Hsu, Fremont, CA (US);
Luoqi Chen, Saratoga, CA (US);
Hanying Feng, Fremont, CA (US);
Rafael C. Howell, Santa Clara, CA (US); Xinjian Zhou, Fremont, CA (US); Yi-Fan Chen, Sunnyvale, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 970 days.

(21) Appl. No.: 13/293,116

(22) Filed: Nov. 9, 2011

(65) Prior Publication Data

US 2012/0113404 A1    May 10, 2012

Related U.S. Application Data

(60) Provisional application No. 61/412,381, filed on Nov. 10, 2010.

(51) Int. Cl.
*G06F 17/50* (2006.01)
*G03F 7/20* (2006.01)

(52) U.S. Cl.
CPC .................. *G03F 7/705* (2013.01)

(58) Field of Classification Search
USPC .......................................... 716/55
See application file for complete search history.

(56) References Cited

U.S. PATENT DOCUMENTS 5,229,872 A    7/1993   Mumola
5,296,891 A    3/1994   Vogt et al.
(Continued)

FOREIGN PATENT DOCUMENTS

WO    2010/059954    5/2010
WO    2011/051249    5/2011

OTHER PUBLICATIONS

U.S. Appl. No. 61/412,372, filed Nov. 10, 2010, Hanying Feng et al.
(Continued)

*Primary Examiner* — Bryce Aisaka
(74) *Attorney, Agent, or Firm* — Pillsbury Winthrop Shaw Pittman LLP

(57) ABSTRACT

Embodiments of the present invention provide methods for optimizing a lithographic projection apparatus including optimizing projection optics therein. The current embodiments include several flows including optimizing a source, a mask, and the projection optics and various sequential and iterative optimization steps combining any of the projection optics, mask and source. The projection optics is sometimes broadly referred to as "lens", and therefore the optimization process may be termed source mask lens optimization (SMLO). SMLO may be desirable over existing source mask optimization process (SMO) or other optimization processes that do not include projection optics optimization, partially because including the projection optics in the optimization may lead to a larger process window by introducing a plurality of adjustable characteristics of the projection optics. The projection optics may be used to shape wavefront in the lithographic projection apparatus, enabling aberration control of the overall imaging process.

22 Claims, 21 Drawing Sheets

(56) References Cited

U.S. PATENT DOCUMENTS

| | | |
|---|---|---|
| 5,523,193 A | 6/1996 | Nelson |
| 5,663,893 A | 9/1997 | Wampler et al. |
| 5,821,014 A | 10/1998 | Chen et al. |
| 5,969,441 A | 10/1999 | Loopstra et al. |
| 6,046,792 A | 4/2000 | Van Der Werf et al. |
| 6,541,167 B2 | 4/2003 | Petersen et al. |
| 6,670,081 B2 | 12/2003 | Laidig et al. |
| 7,003,758 B2 | 2/2006 | Ye et al. |
| 7,245,356 B2 | 7/2007 | Hansen |
| 7,342,646 B2 | 3/2008 | Shi et al. |
| 7,587,704 B2 | 9/2009 | Ye et al. |
| 8,570,485 B2 | 10/2013 | Ye et al. |
| 2004/0265707 A1 | 12/2004 | Socha |
| 2006/0126046 A1 | 6/2006 | Hansen |
| 2007/0121090 A1* | 5/2007 | Chen .................. G03F 7/70283 355/67 |
| 2007/0186206 A1* | 8/2007 | Abrams et al. ................. 716/19 |
| 2009/0157360 A1* | 6/2009 | Ye et al. ........................... 703/2 |
| 2009/0296055 A1 | 12/2009 | Ye et al. |
| 2011/0099526 A1 | 4/2011 | Liu |
| 2012/0052418 A1* | 3/2012 | Tian et al. ........................ 430/5 |

OTHER PUBLICATIONS

Chris Spence, "Full-Chip Lithography Simulation and Design Analysis—How OPC is Changing IC Design," Proc. SPIE, vol. 5751, pp. 1-14 (2005).

Y. Cao et al., "Optimized Hardware and Software for Fast, Full Chip Simulation," Proc. SPIE, vol. 5754, pp. 407-414 (2005).

Alan E. Rosenbluth et al., "Optimum Mask and Source Patterns to Print a Given Shape," Journal of Microlithography, Microfabrication, Microsystems, vol. 1, No. 1, pp. 13-20 (Apr. 2002).

Yuri Granik, "Source Optimization for Image Fidelity and Throughput," Journal of Microlithography, Microfabrication, Microsystems, vol. 3, No. 4, pp. 509-522 (Oct. 2004).

Robert Socha et al., "Simultaneous Source Mask Optimization (SMO)," Proc. of SPIE, vol. 5853, pp. 180-193 (2005).

* cited by examiner

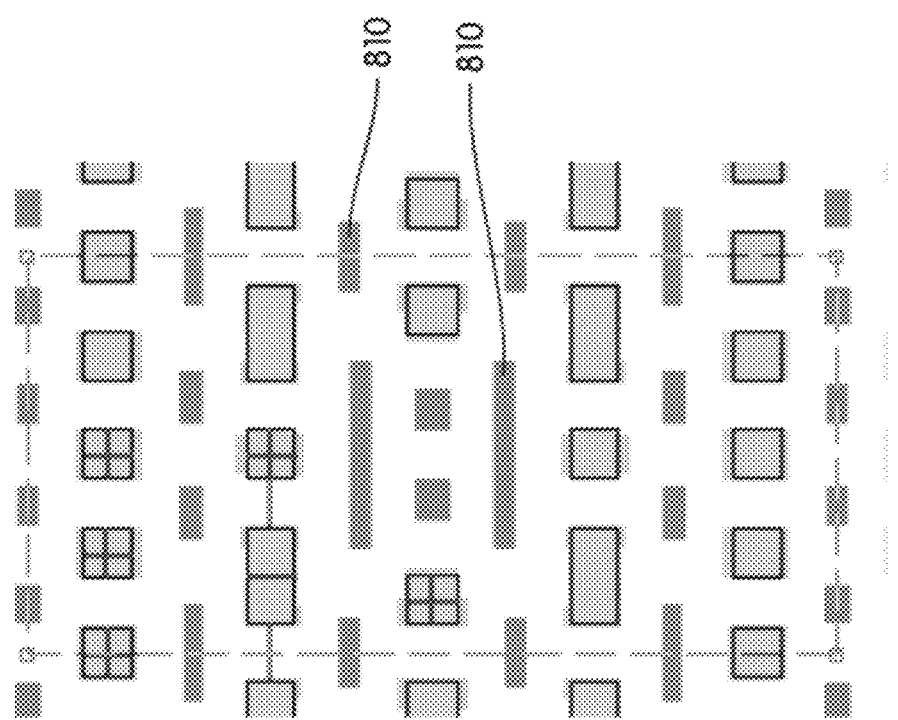

OPTIMIZATION FLOWS OF SOURCE, MASK AND PROJECTION OPTICS

CROSS-REFERENCE TO RELATED APPLICATIONS

This application claims priority to U.S. Provisional Application No. 61/412,381, filed Nov. 10, 2010, the contents of which are incorporated by reference herein in its entirety.

FIELD OF THE INVENTION

The claimed invention relates to lithographic apparatuses and processes, and more particularly to tools for simultaneously or alternatively optimizing illumination sources, masks/design layouts and projection optics for use in lithographic apparatuses and processes.

BACKGROUND OF THE INVENTION

A lithographic projection apparatus can be used, for example, in the manufacture of integrated circuits (ICs). In such a case, a mask may contain a circuit pattern corresponding to an individual layer of the IC ("design layout"), and this circuit pattern can be transferred onto a target portion (e.g. comprising one or more dies) on a substrate (e.g., silicon wafer) that has been coated with a layer of radiation-sensitive material ("resist"), by methods such as irradiating the target portion through the circuit pattern on the mask. In general, a single substrate contains a plurality of adjacent target portions to which the circuit pattern is transferred successively by the lithographic projection apparatus, one target portion at a time. In one type of lithographic projection apparatuses, the circuit pattern on the entire mask is transferred onto one target portion in one go; such an apparatus is commonly referred to as a wafer stepper. In an alternative apparatus, commonly referred to as a step-and-scan apparatus, a projection beam scans over the mask in a given reference direction (the "scanning" direction) while synchronously moving the substrate parallel or anti-parallel to this reference direction. Different portions of the circuit pattern on the mask are transferred to one target portion progressively. Since, in general, the lithographic projection apparatus will have a magnification factor M (generally <1), the speed F at which the substrate is moved will be a factor M times that at which the projection beam scans the mask. More information with regard to lithographic devices as described herein can be gleaned, for example, from U.S. Pat. No. 6,046,792, incorporated herein by reference.

Prior to transferring the circuit pattern from the mask to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, will have to be repeated for each layer. Eventually, a device will be present in each target portion on the substrate. These devices are then separated from one another by a technique such as dicing or sawing, whence the individual devices can be mounted on a carrier, connected to pins, etc.

As noted, microlithography is a central step in the manufacturing of ICs, where patterns formed on substrates define functional elements of the ICs, such as microprocessors, memory chips etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the light from the illumination source.

This process in which features with dimensions smaller than the classical resolution limit of a lithographic projection apparatus are printed, is commonly known as low-$k_1$ lithography, according to the resolution formula $CD=k_1 \times \lambda / NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the wafer that resembles the shape and dimensions planned by a circuit designer in order to achieve particular electrical functionality and performance. To overcome these difficulties, sophisticated fine-tuning steps are applied to the lithographic projection apparatus as well as to the design layout. These include, for example, but not limited to, optimization of NA and optical coherence settings, customized illumination schemes, use of phase shifting masks, optical proximity correction (OPC, sometimes also referred to as "optical and process correction") in the design layout, or other methods generally defined as "resolution enhancement techniques" (RET).

As one important example, OPC addresses the fact that the final size and placement of an image of the design layout projected on the substrate will not be identical to, or simply depend only on the size and placement of the design layout on the mask. It is noted that the terms "mask" and "reticle" are utilized interchangeably herein. Also, person skilled in the art will recognize that, especially in the context of lithography simulation/optimization, the term "mask" and "design layout" can be used interchangeably, as in lithography simulation/optimization, a physical mask is not necessarily used but a design layout can be used to represent a physical mask. For the small feature sizes and high feature densities present on some design layout, the position of a particular edge of a given feature will be influenced to a certain extent by the presence or absence of other adjacent features. These proximity effects arise from minute amounts of light coupled from one feature to another and/or non-geometrical optical effects such as diffraction and interference. Similarly, proximity effects may arise from diffusion and other chemical effects during post-exposure bake (PEB), resist development, and etching that generally follow lithography.

In order to ensure that the projected image of the design layout is in accordance with requirements of a given target circuit design, proximity effects need to be predicted and compensated for, using sophisticated numerical models, corrections or pre-distortions of the design layout. The article "Full-Chip Lithography Simulation and Design Analysis—How OPC Is Changing IC Design", C. Spence, Proc. SPIE, Vol. 5751, pp 1-14 (2005) provides an overview of current "model-based" optical proximity correction processes. In a typical high-end design almost every feature of the design layout requires some modification in order to achieve high fidelity of the projected image to the target design. These modifications may include shifting or biasing of edge positions or line widths as well as application of "assist" features that are intended to assist projection of other features.

Application of model-based OPC to a target design requires good process models and considerable computational resources, given the many millions of features typically present in a chip design. However, applying OPC is generally not an "exact science", but an empirical, iterative process that does not always compensate for all possible proximity effect. Therefore, effect of OPC, e.g., design layouts after application of OPC and any other RET, need to be verified by design inspection, i.e. intensive full-chip simulation using calibrated numerical process models, in order to minimize the possibility of design flaws being built into the manufacturing of a mask. This is driven by the enormous cost of making high-end masks, which run in the multi-million dollar range, as well as by the impact on turn-around time by reworking or repairing actual masks once they have been manufactured.

Both OPC and full-chip RET verification may be based on numerical modeling systems and methods as described, for example in, U.S. Pat. No. 7,003,758 and an article titled "Optimized Hardware and Software For Fast, Full Chip Simulation", by Y. Cao et al., Proc. SPIE, Vol. 5754, 405 (2005).

In addition to optimization to design layouts or masks (e.g., OPC), the illumination source can also optimized, either jointly with mask optimization or separately, in an effort to improve the overall lithography fidelity. Since the 1990s, many off-axis illumination sources, such as annular, quadrupole, and dipole, have been introduced, and have provided more freedom for OPC design, thereby improving the imaging results, As is known, off-axis illumination is a proven way to resolve fine structures (i.e., target features) contained in the mask. However, when compared to a traditional illumination source, an off-axis illumination source usually provides less light intensity for the aerial image (AI). Thus, it becomes necessary to attempt to optimize the illumination source to achieve the optimal balance between finer resolution and reduced light intensity. The terms "illumination source" and "source" are used interchangeably in this document.

Numerous illumination source optimization approaches can be found, for example, in an article by Rosenbluth et al., titled "Optimum Mask and Source Patterns to Print A Given Shape", Journal of Microlithography, Microfabrication, Microsystems 1(1), pp. 13-20, (2002). The source is partitioned into several regions, each of which corresponds to a certain region of the pupil spectrum. Then, the source distribution is assumed to be uniform in each source region and the brightness of each region is optimized for process window. However, such an assumption that the source distribution is uniform in each source region is not always valid, and as a result the effectiveness of this approach suffers. In another example set forth in an article by Granik, titled "Source Optimization for Image Fidelity and Throughput", Journal of Microlithography, Microfabrication, Microsystems 3(4), pp. 509-522, (2004), several existing source optimization approaches are overviewed and a method based on illuminator pixels is proposed that converts the source optimization problem into a series of non-negative least square optimizations. Though these methods have demonstrated some successes, they typically require multiple complicated iterations to converge. In addition, it may be difficult to determine the appropriate/optimal values for some extra parameters, such as y in Granik's method, which dictates the trade-off between optimizing the source for wafer image fidelity and the smoothness requirement of the source.

For low $k_1$ photolithography, optimization of both the source and mask is very useful to ensure a viable process window for projection of critical circuit patterns. Some algorithms (e.g. Socha et. al. Proc. SPIE vol. 5853, 2005, p. 180) discretize illumination into independent source points and mask into diffraction orders in the spatial frequency domain, and separately formulate a cost function (which is defined as a function of selected design variables) based on process window metrics such as exposure latitude which could be predicted by optical imaging models from source point intensities and mask diffraction orders. The term "design variables" as used herein means a set of parameters of a lithographic projection apparatus, for example, parameters a user of the lithographic projection apparatus can adjust. It should be appreciated that any characteristics of a lithographic projection apparatus, including those of the source, the mask, the projection optics, can be among the design variables in the optimization. The cost function is often a non-linear function of the design variables. Then standard optimization techniques are used to minimize the cost function.

One problem with these algorithms that formulate a cost function is that they require a large number of full forward optical imaging model simulations before convergence on both optimal source and mask is reached. Optimizing the lithographic projection apparatus using a clip (which is defined as a portion of a design layout with calibration features that can be used for optimization of the lithographic projection apparatus, as elaborated further in the detailed description section) of medium complexity can take weeks or even months on latest standard PC hardware, which is generally considered impractical. A practical optimization process generally costs less than about 24 hours.

Relatedly, the delay of EUV lithography and the pressure of ever decreasing design rules have driven semiconductor chipmakers to move deeper into the low $k_1$ lithography era with existing 193 nm ArF lithography. Lithography towards lower $k_1$ puts heavy demands on RET, exposure tools, and the need for litho-friendly design. The 1.35 ArF hyper numerical apertures (NA) exposure tool will be the exposure tool for chip manufactures to use in the next two years. To ensure that circuit design can be produced on to the substrate with workable process window; source-mask optimization (SMO) is becoming an important RET that is required for 2× nm node.

A source and mask (design layout) optimization method and system that allow for simultaneous optimization of the source and mask using a cost function without constraints and within a practicable amount of time is described in a commonly assigned International Patent Application No. PCT/US2009/065359, filed on Nov. 20, 2009, and published as WO2010/059954, titled "Fast Freeform Source and Mask Co-Optimization Method", which is hereby incorporated by reference in its entirety.

New development in hardware and software of lithographic projection apparatuses provides more flexibility by making projection optics therein adjustable. The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics can include optical components for shaping, adjusting and/or projecting light from the source before the light passes the mask, and/or optical components for shaping, adjusting and/or projecting the light after the light passes the mask. The projection optics generally exclude the source and the mask.

For example, adjustable parameters ("knobs") of the projection optics make it possible to shape light in more degrees of freedom (e.g., wavefront shape, intensity distribution, etc.) and/or to accommodate a wider range of conditions of the source and the mask (namely to provide a larger process window (PW)), than what is offered by the existing SMO techniques.

However, optimizing these additional knobs entails very high computation cost. Therefore, methods to simplify and accelerate optimization of these knobs related to the projection optics jointly with knobs associated with the source and mask is desirable.

Therefore what is needed is a computationally-efficient comprehensive optimization method and flows for characterizing a lithographic process based on which the setting of a lithographic apparatus (including setting of a projection optics system) is decided and a mask is designed.

BRIEF SUMMARY OF THE INVENTION

Embodiments as described herein provide methods and flows for improving or optimizing a lithographic projection apparatus including improving or optimizing projection optics therein, and preferably including the capability of improving or optimizing a source, a mask, and the projection optics, simultaneously or alternatively. The flows are targeted to represent possible workflows which may, for example, be used to optimize or improve the lithographic projection apparatus together with the design layout for a specific design. The projection optics is sometimes referred to as "lens", and therefore the joint optimization process may be termed source mask lens optimization (SMLO). Another term used to describe the SMLO process is source mask pupil optimization (SMPO), as in certain embodiments, lens optimization is done for the pupil plane of the projection optics. However, the scope of the invention is not restricted to optimization in the pupil plane only. SMLO is desirable over existing source mask optimization process (SMO), and other optimization processes that do not take into account projection optics optimization, partially because including the projection optics in the optimization can lead to a larger process window by introducing a plurality of adjustable characteristics of the projection optics. The projection optics can be used to shape a wavefront in the lithographic projection apparatus. According to the embodiments herein, the adjustable characteristics of the projection optics allows a larger process window than previously possible with SMO. Although adjustable characteristics of the projection optics, the source and the mask are used in the description of the embodiments, other adjustable characteristics of the lithographic projection apparatus, such as, dose and focus, can be adjusted in the optimization.

The embodiments herein improve or optimize the lithographic projection apparatus by minimizing a suitable cost function of design variables that can be characteristics of the source, projection optics, and the mask. Non-limiting examples of the cost function are given. Other forms of the cost function are also possible and can accommodate a wide variety of lithography metrics. The cost function can be a linear or non-linear function of the design variables.

Methods of simultaneous SMLO and alternative SMLO have been disclosed. The SMLO process can be accelerated by combining the SMLO with a various pattern selection methods. Also flows including Full chip SMLO in which the SMLO is initially applied to a selected subgroup of portions of the design after which the remainder of the chip is corrected via a final mask optimization step while holding, for example, the source and lens parameters fixed, is included.

In an embodiment of the present invention, the optimized process recipe, and the outputs of optimization steps within the method of the invention, need not be globally optimum solutions. Rather the term optimization is used herein to refer to a process that identifies values for imaging parameters that provide an improvement, e.g. a local optimum, in at least one relevant metric, compared to an initial set of values for those parameters. "Optimum" and other related terms should be construed accordingly. In an embodiment of the present invention, optimization steps can be applied iteratively to provide further improvements in one or more metrics.

BRIEF DESCRIPTION OF THE DRAWINGS

The above and other aspects and features of the present invention will become apparent to those ordinarily skilled in the art upon review of the following description of specific embodiments of the invention in conjunction with the accompanying figures, wherein:

FIGS. 8A-8F show the Source-Mask-Lens optimization as shown in FIG. 4B applied to a portion of a design;

DETAILED DESCRIPTION OF THE INVENTION

Figure 1:
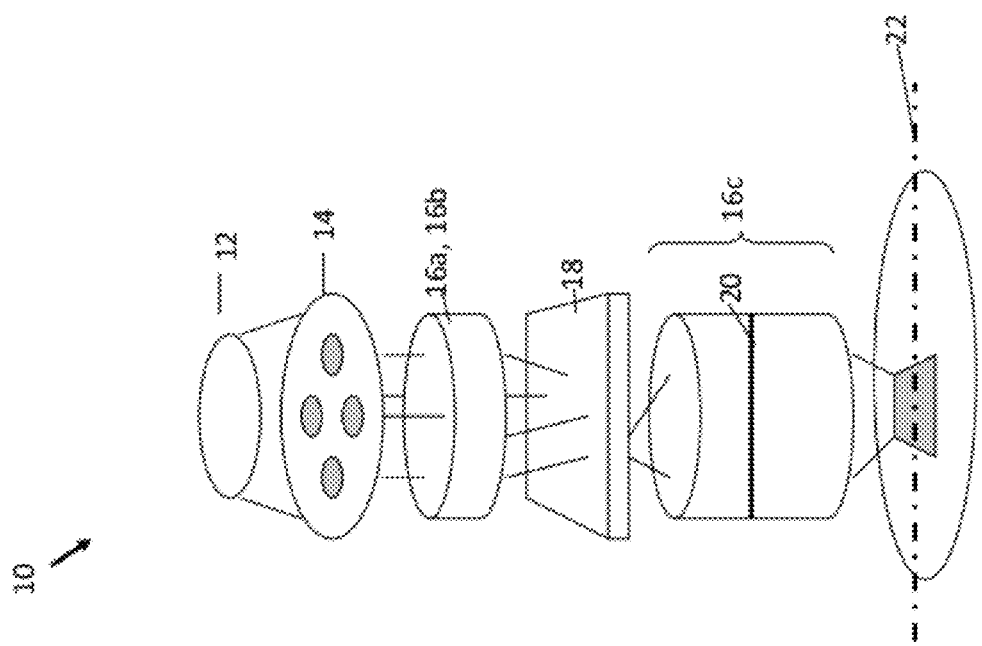
FIG. 1 is a block diagram of various subsystems of a lithography system according to example implementations of the present invention.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term "optimizing" and "optimization" as used herein mean adjusting a lithographic projection apparatus such that results and/or processes of lithography have more desirable characteristics, such as higher accuracy of projection of design layouts on a substrate, larger process windows, etc.

Further, the lithographic projection apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic projection apparatuses are described, for example, in U.S. Pat. No. 5,969,441, incorporated herein by reference.

The mask referred to above comprise design layouts. The design layouts can be generated utilizing CAD (computer-aided design) programs, this process often being referred to as EDA (electronic design automation). Most CAD programs follow a set of predetermined design rules in order to create functional design layouts/masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the substrate (via the mask).

The term mask as employed in this text may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning means include:

a programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.

a programmable LCD array. An example of such a construction is given in U.S. Pat. No. 5,229,872, which is incorporated herein by reference.

As a brief introduction, FIG. 1 illustrates an exemplary lithographic projection apparatus 10. Major components are an illumination source 12, which may be a deep-ultraviolet excimer laser source or other type of sources including extreme ultra violet (EUV) sources, illumination optics which define the partial coherence (denoted as sigma) and which may include optics 14, 16a and 16b that shape light from the source 12; a mask or reticle 18; and transmission optics 16c that project an image of the reticle pattern onto a substrate plane 22. An adjustable filter or aperture 20 at the pupil plane of the projection optics may restrict the range of beam angles that impinge on the substrate plane 22, where the largest possible angle defines the numerical aperture of the projection optics $NA = \sin(\Theta_{max})$.

In an optimization process of a system, a figure of merit of the system can be represented as a cost function. The optimization process boils down to a process of finding a set of parameters (design variables) of the system that minimizes the cost function. The cost function can have any suitable form depending on the goal of the optimization. For example, the cost function can be weighted root mean square (RMS) of deviations of certain characteristics (evaluation points) of the system with respect to the intended values (e.g., ideal values) of these characteristics; the cost function can also be the maximum of these deviations. The term "evaluation points" herein should be interpreted broadly to include any characteristics of the system. The design variables of the system can be confined to finite ranges and/or be interdependent due to practicalities of implementations of the system. In case of a lithographic projection apparatus, the constraints are often associated with physical properties and characteristics of the hardware such as tunable ranges, and/or mask manufacturability design rules, and the evaluation points can include physical points on a resist image on a substrate, as well as non-physical characteristics such as dose and focus.

In a lithographic projection apparatus, a source provides illumination (i.e. light); projection optics direct and shapes the illumination through a mask and onto a substrate. The term "projection optics" is broadly defined here to include any optical component that may alter the wavefront of the radiation beam. For example, projection optics may include at least some of the components 14, 16a, 16b and 16c. An aerial image (AI) is the light intensity distribution on the substrate. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in commonly assigned U.S. patent application Ser. No. 12/315,849, disclosure of which is hereby incorporated by reference in its entirety. The resist model is related only to properties of the resist layer (e.g., effects of chemical processes which occur during exposure, PEB and development). Optical properties of the lithographic projection apparatus (e.g., properties of the source, the mask and the projection optics) dictate the aerial image. Since the mask used in the lithographic projection apparatus can be changed, it is desirable to separate the optical properties of the mask from the optical properties of the rest of the lithographic projection apparatus including at least the source and the projection optics.

Figure 2:
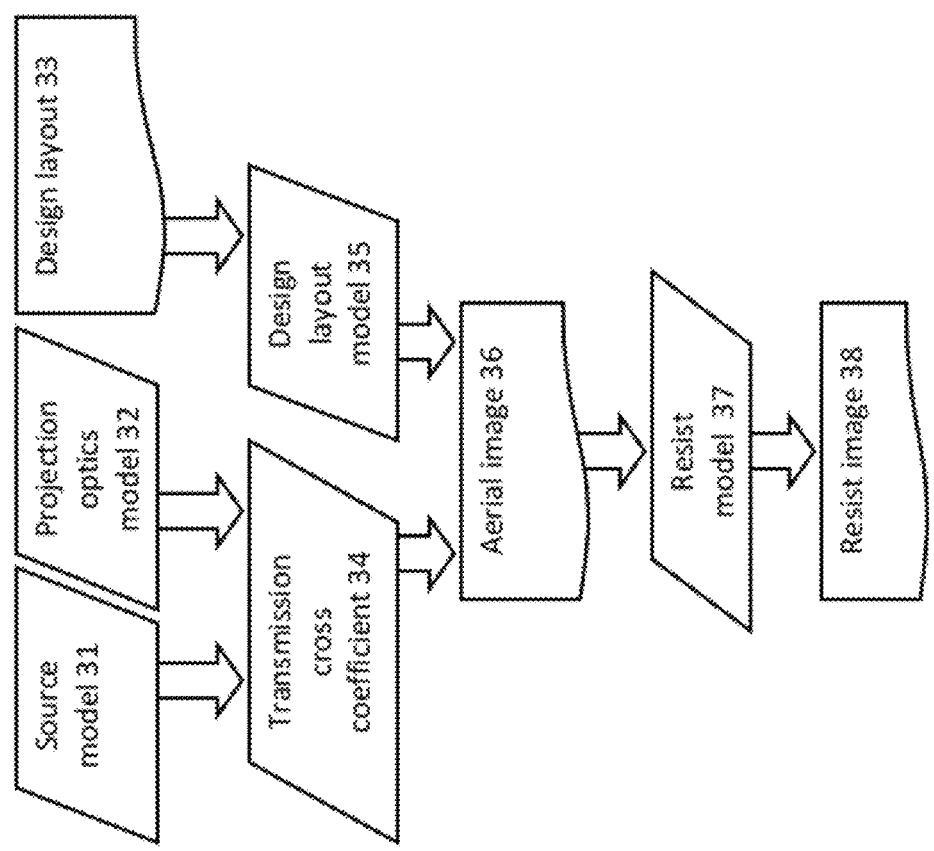
FIG. 2 is a block diagram of simulation models corresponding to the subsystems in FIG. 1.

An exemplary flow chart for simulating lithography in a lithographic projection apparatus is illustrated in FIG. 2. A source model 31 represents optical characteristics (including light intensity distribution and/or phase distribution) of the source. A projection optics model 32 represents optical characteristics (including changes to the light intensity distribution and/or the phase distribution caused by the projection optics) of the projection optics. The source model 31 and the projection optics model 32 can be combined, as explained later herein, into a transmission cross coefficient (TCC) model 34. A design layout model 35 represents optical characteristics (including changes to the light intensity distribution and/or the phase distribution caused by a given design layout 33) of a design layout 33, which is the representation of an arrangement of features on a mask. An aerial image 36 can be simulated from the transmission cross coefficient 34 and the design layout model 35. A resist image 37 can be simulated from the aerial image 36 using a resist model 37. Simulation of lithography can, for example, predict contours and CDs in the resist image.

More specifically, it is noted that the source model 31 can represent the optical characteristics of the source that include, but not limited to, NA-sigma (σ) settings as well as any particular illumination source shape (e.g. off-axis light sources such as annular, quadrupole, and dipole, etc.). The projection optics model 32 can represent the optical characteristics of the of the projection optics that include aberration, distortion, refractive indexes, physical sizes, physical dimensions, etc. The design layout model 35 can also represent physical properties of a physical mask, as described, for example, in U.S. Pat. No. 7,587,704, which is incorporated by reference in its entirety. The objective of the simulation is to accurately predict, for example, edge placements and CDs, which can then be compared against an intended design. The intended design is generally defined as a pre-OPC design layout which can be provided in a standardized digital file format such as GDSII or OASIS or other file format.

From this design layout, one or more portions may be identified, which are referred to as "clips". In a specific embodiment of the invention, a set of clips is extracted, which represents the complicated patterns in the design layout (typically about 50 to 1000 clips, although any number of clips may be used). As will be appreciated by those skilled in the art, these patterns or clips represent small portions (i.e. circuits, cells or patterns) of the design and especially the clips represent small portions for which particular attention and/or verification is needed. In other words, clips may be the portions of the design layout or may be similar or have a similar behavior of portions of the design layout where critical features are identified either by experience (including clips provided by a customer), by trial and error, or by running a full-chip simulation. Clips usually contain one or more test patterns or gauge patterns.

An initial larger set of clips may be provided a priori by a customer based on known critical feature areas in a design layout which require particular image optimization. Alternatively, in another embodiment of the present invention, the initial larger set of clips may be extracted from the entire design layout by using some kind of automated (such as, machine vision) or manual algorithm that identifies the critical feature areas.

To reduce the overall computation burden, various ways of optimization can be envisioned. In one embodiment, first a set of clips is selected by a pattern selection method based on diffraction signature analysis or any other method, and then the SMLO process is performed. Alternatively, first a full chip simulation is performed, 'hot spots' and/or 'warm spots' are identified from the full chip simulation, and then a pattern selection step is performed. The optimization is done based on the selected patterns. The pattern selection algorithm (based on diffraction signature analysis or other methods) can be seamlessly integrated with the SMLO process.

In a lithographic projection apparatus, as an example, a cost function may be expressed as $$CF(z_1, z_2, \ldots, z_N) = \sum_{p=1}^{P} w_p f_p^2(z_1, z_2, \ldots, z_N) \quad \text{(Eq. 1)}$$

wherein $(z_1, z_2, \ldots, z_N)$ are N design variables or values thereof; $f_p(z_1, z_2, \ldots, z_N)$ is a difference between an actual value and an intended value of a characteristic at the p-th evaluation point for a set of values of the design variables of $(z_1, z_2, \ldots, z_N)$. $w_p$ is a weight constant assigned to the p-th evaluation point. An evaluation point or pattern more critical than others can be assigned a higher $w_p$ value. Patterns and/or evaluation points with larger number of occurrences may be assigned a higher $w_p$ value, too. Examples of the evaluation points can be any physical point or pattern on the wafer, or any point on a virtual design layout, or resist image, or aerial image. The cost function may represent any suitable characteristics of the lithographic projection apparatus or the substrate, for instance, focus, CD, image shift, image distortion, image rotation, etc. Since it is the resist image that often dictates the circuit pattern on a substrate, the cost function often includes functions that represent some characteristics of the resist image. For example, $f_p(z_1, z_2, \ldots, z_N)$ of such an evaluation point can be simply a distance between a point in the resist image to an intended position of that point (i.e., edge placement error $EPE_p(z_1, z_2, \ldots, z_N)$). The design variables can be any adjustable parameters such as adjustable parameters of the source, the mask, the projection optics, dose, focus, etc. Preferably, at least some of the design variables are adjustable characteristics of the projection optics. The projection optics may include components collectively called as "wavefront manipulator" that can be used to adjust shapes of a wavefront and intensity distribution and/or phase shift of the irradiation beam. The projection optics preferably can adjust a wavefront and intensity distribution at any location along an optical path of the lithographic projection apparatus, such as before the mask, near a pupil plane, near an image plane, near a focal plane. The projection optics can be used to correct or compensate for certain distortions of the wavefront and intensity distribution caused by, for example, the source, the mask, temperature variation in the lithographic projection apparatus, thermal expansion of components of the lithographic projection apparatus. Adjusting the wavefront and intensity distribution can change values of the evaluation points and the cost function. Such changes can be simulated from a model or actually measured.

It should be noted that the normal weighted root mean square (RMS) of $f_p$ ($z_1, z_2, \ldots, z_N$) is defined as $$\sqrt{\frac{1}{P}\sum_{p=1}^{P} w_p f_p^2(z_1, z_2, \ldots, z_N)},$$

therefore, minimizing the weighted RMS of $f_p$ ($z_1, z_2, \ldots, z_N$) is equivalent to minimizing the cost function $$CF(z_1, z_2, \ldots, z_N) = \sum_{p=1}^{P} w_p f_p^2(z_1, z_2, \ldots, z_N),$$

defined in Eq. 1. Thus the weighted RMS of $f_p$ ($z_1, z_2, \ldots, z_N$) and Eq. 1 may be utilized interchangeably for notational simplicity herein.

Further, if we are considering maximizing the PW (Process Window), we can consider the same physical location from different PW conditions as different evaluation points in the cost function in (Eq.1). For example, if we are considering N PW conditions, then we can categorize the evaluation points according to their PW conditions. and write the cost functions as:

$$CF(z_1, z_2, \ldots, z_N) = \qquad \text{(Eq. 1')}$$
$$\sum_{p=1}^{P} w_p f_p^2(z_1, z_2, \ldots, z_N) = \sum_{u=1}^{U} \sum_{p_u=1}^{P_u} w_{p_u} f_{p_u}^2(z_1, z_2, \ldots, z)$$

Where $f_{p_u}$ ($z_1, z_2, \ldots, z_N$) is the difference between an actual value and an intended value of the $p_i$-th evaluation point for a set of values of the design variables of ($z_1, z_2, \ldots, z_N$) under the u-th PW condition u=1, ..., U. When this difference is the EPE, then minimizing the above cost function is equivalent to minimizing the edge shift under various PW conditions, thus equivalent to maximizing the PW. In particular, if the PW also consists of different mask bias, then minimizing the above cost function also includes the minimization of MEEF (Mask Error Enhancement Factor), which is defined as the ratio between the wafer EPE and the induced mask edge bias.

The design variables may have constraints, which can be expressed as ($z_1, z_2, \ldots, z_N$)∈Z, where Z is a set of possible values of the design variables.

The optimization process therefore is to find a set of values of the design variables, under the constraints ($z_1, z_2, \ldots, z_N$)∈Z, that minimize the cost function, i.e., to find $$(\tilde{z}_1, \tilde{z}_2, \ldots, \tilde{z}_N) = \operatorname*{argmin}_{(z_1, z_2, \ldots, z_N) \in Z} CF(z_1, z_2, \ldots, z_N) = \qquad \text{(Eq. 2)}$$
$$\operatorname*{argmin}_{(z_1, z_2, \ldots, z_N) \in Z} \sum_{p=1}^{P} w_p f_p^2(z_1, z_2, \ldots, z_N)$$

The detailed mathematical framework of the SMLO process can be found in co-owned provisional application, titled, "Optimization of Source, Mask and Projection Optics," by Feng et al. (application No. 61/412,372), filed on Nov. 10, 2010, and which is incorporated in its entirety by reference.

Figure 3:
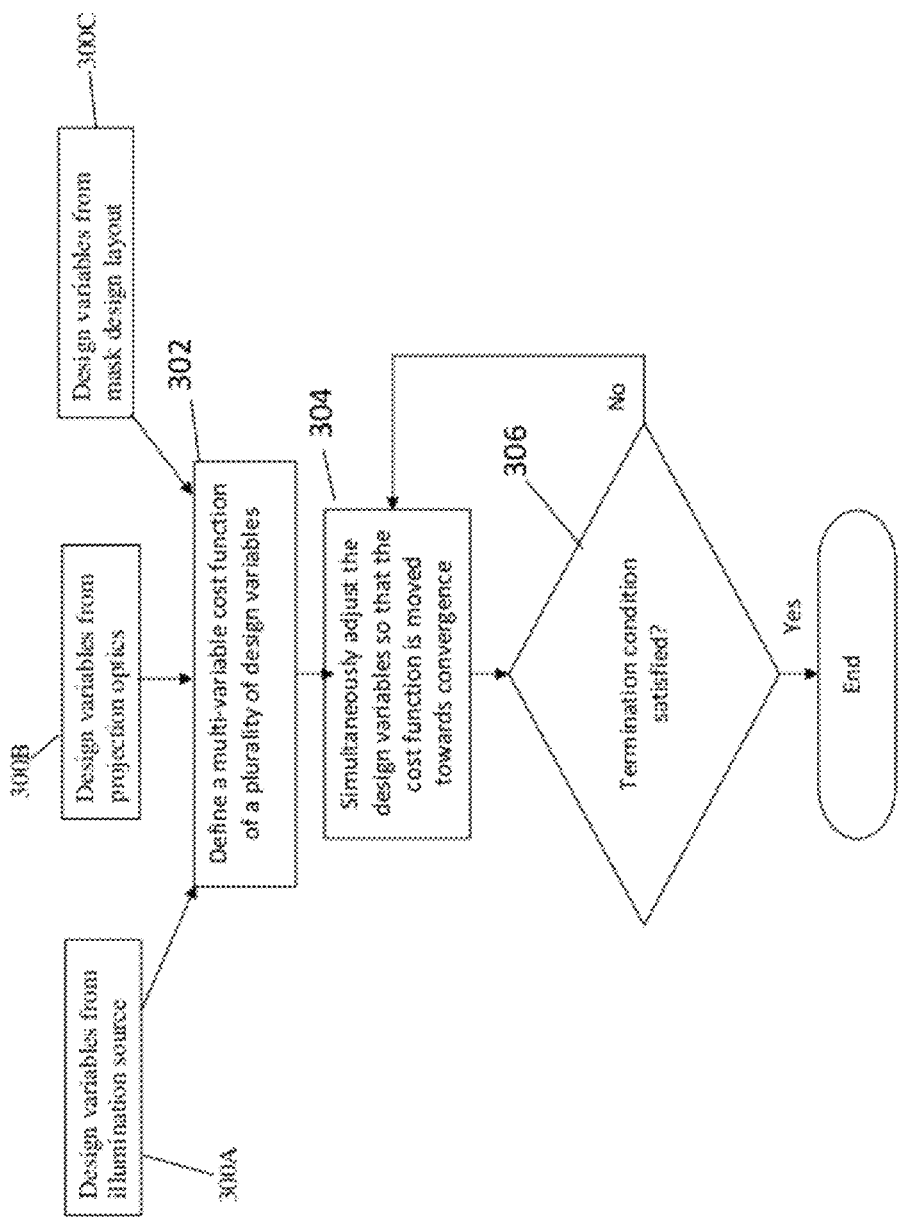
FIG. 3 is a flow diagram illustrating aspects of an example methodology of joint optimization according to the invention.

A general method of optimizing the lithography projection apparatus, according to an embodiment, is illustrated in FIG. 3. This method comprises a step 302 of defining a multi-variable cost function of a plurality of design variables. At least some of the design variables being characteristics of the projection optics, as shown in step 300B. Other design variables may be associated with illumination source (step 300A) and the design layout (step 300C). In step 304, the design variables are simultaneously adjusted so that the cost function is moved towards convergence. In step 306, it is determined whether a predefined termination condition is satisfied. The predetermined termination condition may include various possibilities, i.e. the cost function may be minimized or maximized, as required by the numerical technique used, the value of the cost function has been equal to a threshold value or has crossed the threshold value, the value of the cost function has reached within a preset error limit, or a preset number of iteration is reached. If either of the conditions in step 306 is satisfied, the method ends. If none of the conditions in step 306 is satisfied, the step 304 and 306 are iteratively repeated until a desired result is obtained.

In a lithographic projection apparatus, the source, mask and projection optics can be optimized alternatively (referred to as Alternative Optimization) or optimized simultaneously (referred to as Simultaneous Optimization), according to embodiments. The terms "simultaneous", "simultaneously", "joint" and "jointly" as used herein mean that the design variables of the characteristics of the source, mask, projection optics and/or any other design variables, are allowed to change at the same time. The term "alternative" and "alternatively" as used herein mean that not all of the design variables are allowed to change at the same time.

Figure 4A:
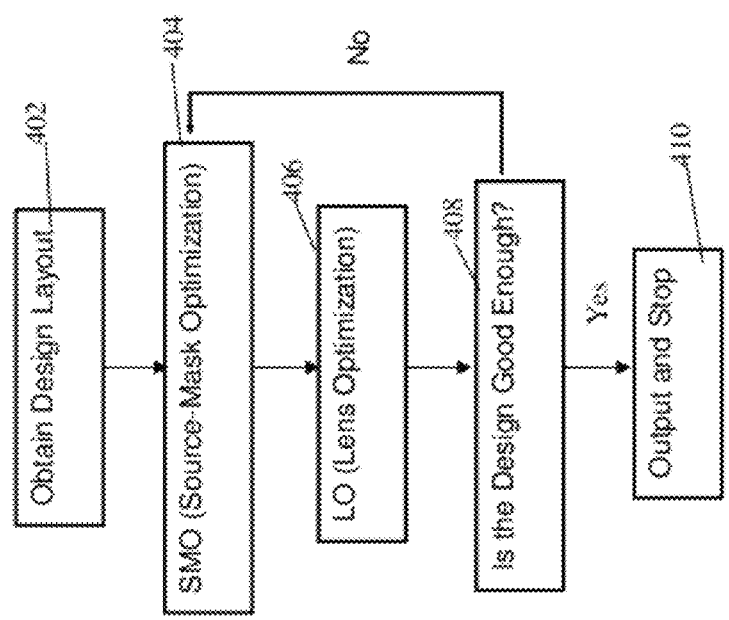
FIG. 4A shows an embodiment of a optimization method or optimization flow, according to an embodiment of the present invention.

In FIG. 3, the optimization of all the design variables is executed simultaneously. We call such flow the simultaneous flow or co-optimization flow. Alternatively, the optimization of all the design variables is executed alternatively, as illustrated in FIG. 4A. In this flow, in each step, some design variables are fixed while the other design variables are optimized to minimize the cost function; then in the next step, a different set of variables are fixed while the others are optimized to minimize the cost function. These steps are executed alternatively until convergence or certain terminating conditions are met. As shown in the non-limiting example flowchart of FIG. 4A, we first obtain a design layout (step 402), then execute a step of SMO (Source-Mask-Optimization) in step 404, where all the design variables from projection optics are fixed while all the other design variables (from the illumination source and mask design layout) are optimized to minimize the cost function. In this SMO the source may be characterized by independent source points and the mask layout or the portion of the design layout used for the SMO may be characterized as, for example, diffraction elements in a spatial frequency domain. This is actually similar as described in the co-pending, co-owned application WO 2010/059954, which is incorporated herein by reference in its entirety. The reconfiguration of the mask layout or the portion of the design layout based on the optimization results includes reconfiguration using optical proximity corrections (OPC) and recharacterizing the reconfigured mask. Then in the next step 406, an LO (Lens Optimization) is performed, where all the design variables from the illumination source and mask design layout are fixed, while the design variables from projection optics are optimized to minimize the cost function. These two steps may be executed alternatively, until certain terminating conditions are met in step 408. Various termination conditions may be used, such as, the value of the cost function becomes equal to a threshold value, the value of the cost function crosses the threshold value, the value of the cost function reaches within a preset error limit, or a preset number of iterations is reached, etc. Note that we use SMO-LO-Alternative-Optimization as an example for the alternative flow. The alternative flow can take many different forms, such as SO-LO-MO-Alternative-Optimization, where we execute SO (Source Optimization), LO (Lens Optimization), and MO (Mask Optimization) alternatively and iteratively; or we can first execute SMO once, then execute LO and MO alternatively and iteratively; and so on. Finally the output of the optimization result is obtained in step 410, and the process stops. Further examples of these flows will be shown in the following FIGs.

Figure 4B:
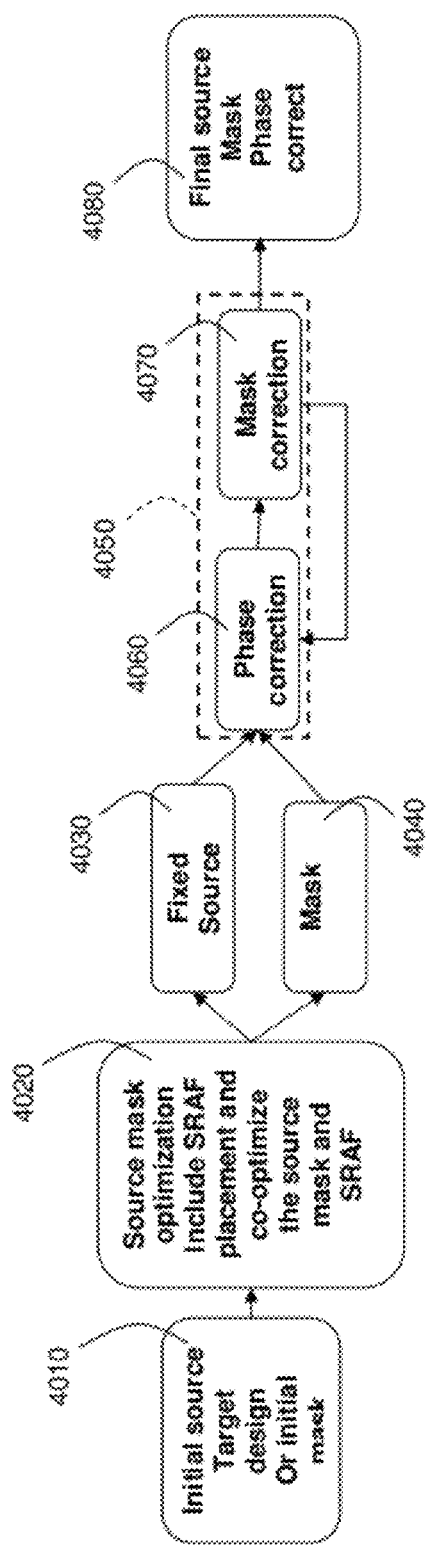
FIG. 4B shows an embodiment of a further optimization method in which the lens and pattern/design layout optimization is done iteratively.

FIG. 4B shows a Source-Mask-Lens flow according to an embodiment of the invention in which in step 4010 an initial source and an initial target design layout are provided. The initial target design layout may, for example, be an actual design layout or a part of an actual design layout or a clip or set of clips or any other representation of an intended design layout. Next a Source-Mask-Optimization is performed on the initial target design layout together with the initial source, which is shown in Step 4020. This Source-Mask-Optimization may include the generation and inclusion of sub-resolution assist features (SRAFs). In one embodiment, the SMO is performed using a free-form SMO. This SMO step may also include a method for selecting, for example, from an initial larger set of clips or parts of the design layout a smaller, more limited set of clips or parts of the design layout to do the SMO on. Such a reduction step by selecting a subset of clips or portions of the design layout typically speeds up the calculation and optimization process. Such selection processes may also be known from the commonly assigned U.S. Patent Application Publ. No. 2011/0099526, and the commonly assigned WO Patent Application Serial No. PCT/EP2010/066106, filed Oct. 26, 2010, the disclosure of which are hereby incorporated by reference in their entireties. The reason for performing this step 4020 as the initial step is to ensure that the optimization of the full SMLO takes place at or near a global minimum of the optimization process. From this SMO process an optimized source and optimized mask or portion of the design layout results, which are indicated in FIG. 4B with steps 4030 and 4040, respectively. In the current process the source layout 4030 is fixed and the optimized mask or optimized portion of the design layout is subsequently used for an iterative process indicated with step 4050, which includes iterative phase correction shown in step 4060 and mask correction or correction of the portion of the design layout, as shown in step 4070. In the phase correction step 4060 a cost function is generated in which the design variables representing the mask (or portion of the design layout) and the source are kept constant and only the design variables representing the phase (associated with projection optics) are allowed to vary such that the phase is optimized. Phase optimization is a type of lens/projection optics optimization. In the mask (or portion of the design layout) correction step 4070, a cost function is generated in which the design variables representing the phase and the source are kept constant and only the design variables representing the mask (or the portion of the design layout) are allowed to vary such that the mask is optimized. If this iterative process results in complying with the predetermined termination condition, the iterative process is stopped and the final source, mask and phase corrections are obtained in step 4080.

Figure 4C:
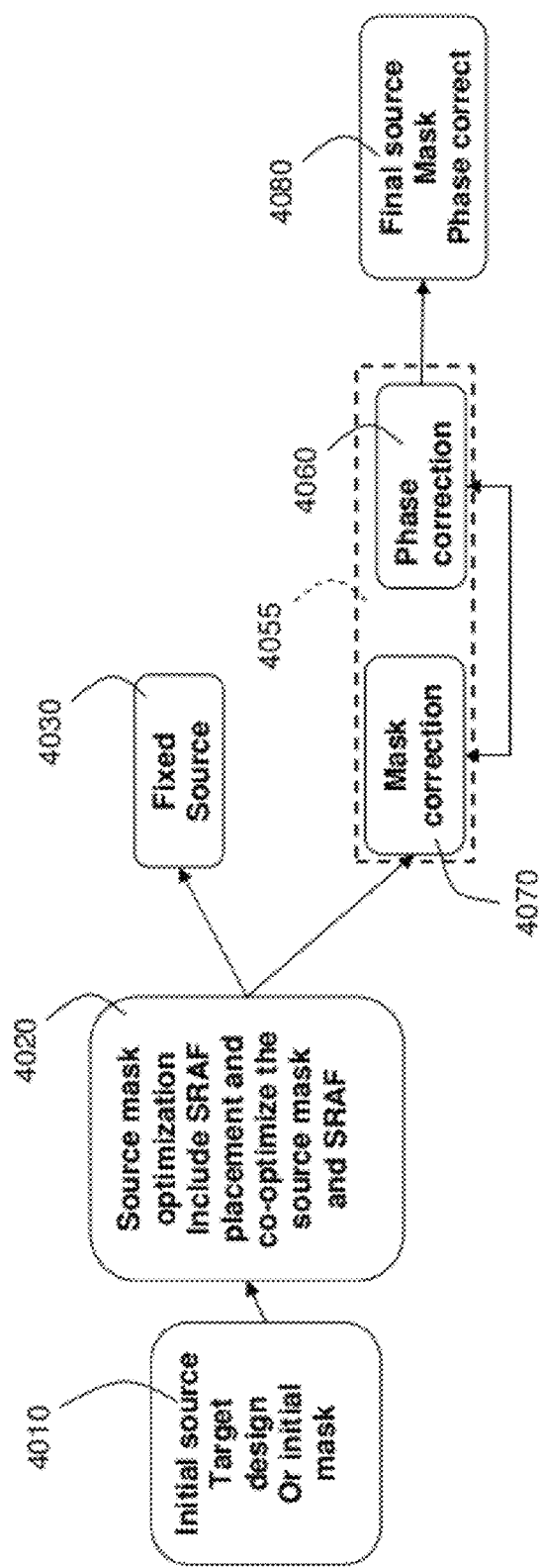
FIG. 4C shows an embodiment of yet another optimization method in which the lens and pattern/design layout optimization is done via co-optimization.

FIG. 4C shows a similar flow as FIG. 4B in which the step 4010 of providing the initial source and target design layout or mask or portion of the design layout, and in which the step 4020 of performing SMO are similar to the flow in FIG. 4B. Again, step 4030 indicates that the optimized source layout is fixed for this example, but now the optimization process of optimizing the mask (or portion of the design layout) and the phase are performed in a co-optimization process in step 4055. In this co-optimization process 4055 a cost function is generated in which the design variables representing the source are kept constant and only the design variables representing the mask (or the portion of the design layout) and the phase are allowed to vary such that the mask together with the phase are optimized simultaneously, or are being co-optimized. Again, if this iterative process results in complying with the predetermined termination condition, the iterative process is stopped and the final source, mask and phase corrections are obtained in step 4080.

Figure 4D:
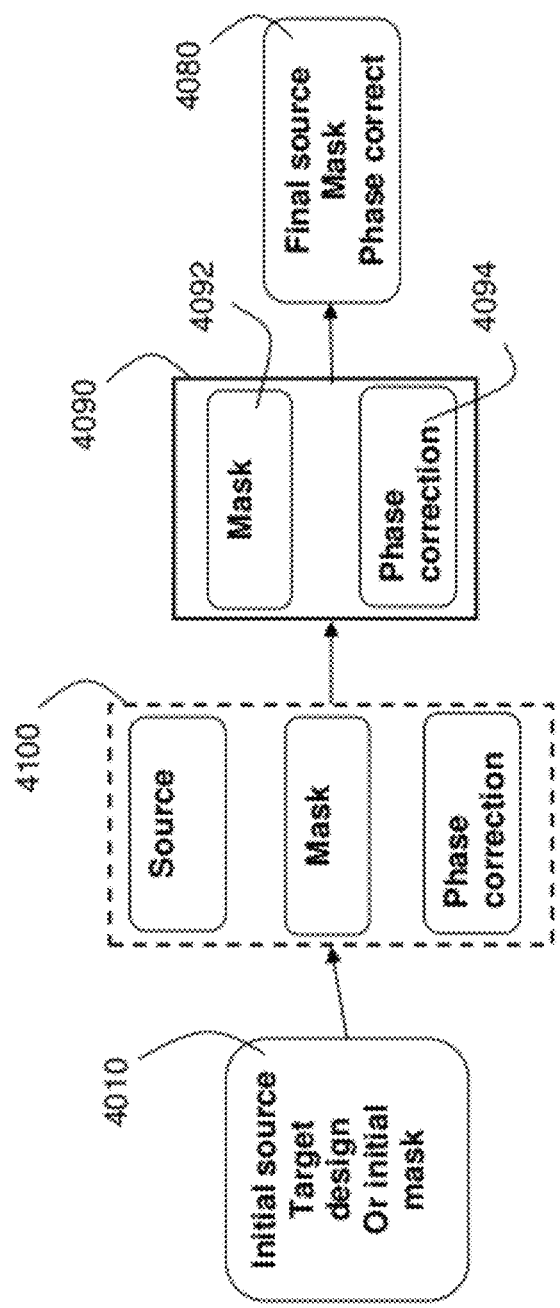
FIG. 4D shows an embodiment of an optimization method in which the source, mask/design layout and lens optimization is done via a co-optimization process.

In FIG. 4D a flow is shown in which a full Source-Mask-Lens-Optimization is shown. The step 4010 of providing the initial source and target design or mask or portion of the design layout is still similar, but instead of a SMO step 4020 as indicated in the previous flows, now a full Source-Mask-Lens-Optimization process is performed in step 4100. In this co-optimization process 4100 a cost function is generated in which the design variables representing the source, the mask (or the portion of the design layout) and the phase are all allowed to vary such that all three parameters together are optimized simultaneously, or are being co-optimized. In an optional tuning step of 4090 further mask and/or phase tuning may be applied in steps 4092 and 4094, respectively, to further optimize the mask and phase corrections, for example, by further tightening or changing the termination condition compared to the SMLO step 4100. Again, if all termination conditions are met, the final source, mask and phase corrections are obtained in step 4080.

It is to be noted that for the example processes in FIGS. 4B-D, separate cost functions can be formulated for various stages of optimization. For example, the cost function for SMO and the cost function for a subsequent LO might not be the same. The cost function for a later stage of optimization may be iteratively updated based on results from a previous step of optimization that uses a different cost function. Similarly, termination conditions may also be different or the same at the end of each optimization step. The claims section elaborate on this concept further.

Persons skilled in the art will also appreciate that pattern selection algorithm, as discussed before, may be integrated with the simultaneous or alternative SMLO. For example, when an alternative SMLO is adopted, first a full-chip SMO can be performed, the 'hot spots' and/or 'warm spots' are identified, then an LO or SLO (source-lens optimization) is performed. Persons skilled in the art will appreciate in view of the present disclosure that numerous permutations and combinations of sub-optimizations are possible in order to achieve the desired optimization results.

Figure 4E:
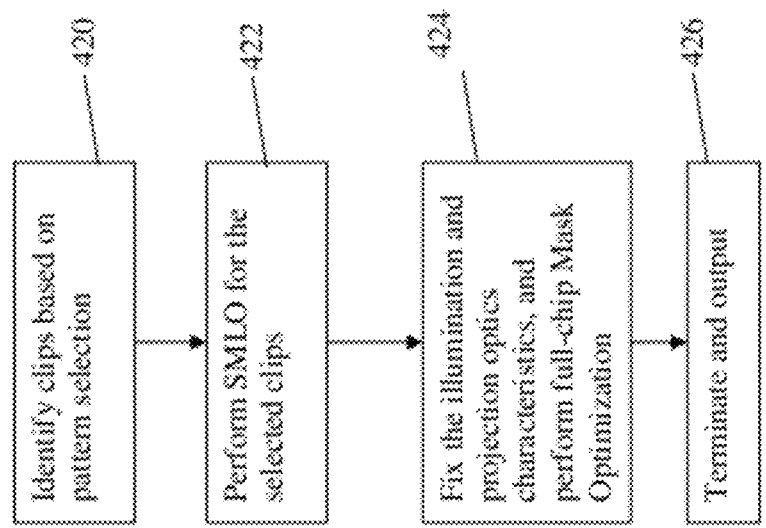
FIGS. 4E-G show various embodiments of the SMLO method, where pattern selection or gauge selection is integrated into the optimization process.

In one example embodiment shown in the flowchart in FIG. 4E, pattern selection is integrated into SMLO to further speed up the optimization process, which is especially useful for full-chip (or whole design layout) optimization. If there are too many clips with too many test patterns (also known as "gauges" or "gauge patterns") and/or too many evaluation points, the optimization may be too slow or require too much storage. In order to reduce the computational cost for large design layout with many gauge patterns, we apply pattern selection to all the gauge patterns. For example, in step 420 we can first identify some important clips (e.g., based on the diffraction characteristics), then in step 422, we can do SMLO for all the evaluation points in these clips, and then, in step 424, we can fix the illumination and projection optics functions from SMLO results, and perform Mask Optimization for the entire design layout. The process terminates in step 426 when the termination conditions are satisfied.

Figure 4F:
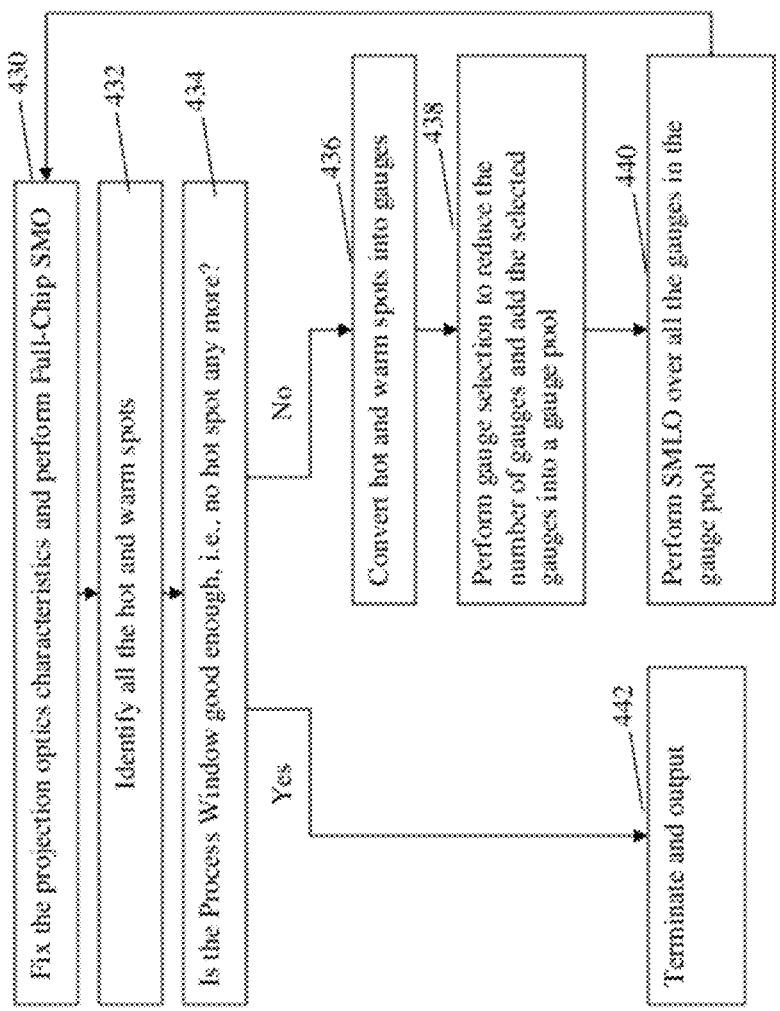

Alternatively, we can identify the gauges through hot spots or warm spots, i.e., the defects or patterns which are almost defects. Such an alternative flow is shown in FIG. 4F. In particular, we can first run a full-chip SMO (step 430) or MO only fixing at least the projection optics characteristics, and identify the hot and warm spots in step 432. If the process window is not good enough, as determined in step 434, the hot spots and warm sports are converted to gauges in step 436. In step 438, a gauge selection or pattern selection method is performed to reduce the number of gauges and add the selected gauges into a gauge pool. In step 440, SMLO is executed on the selected gauge pool. This process can be repeated if necessary. Note that these two alternative flows of FIGS. 4E and 4F can also be applied in combination with other modifications. For example, we can first apply the first flow of FIG. 4A, then identify the resulting hot and warm spots, then apply the second flow of FIG. 4F.

One example SMLO method according to embodiments of the invention will be explained in connection with the flowchart in FIG. 4G. A similar method can be found in commonly assigned U.S. patent application Ser. No. 12/914,946, filed Oct. 28, 2010, the disclosure of which is hereby incorporated by reference in its entirety. The difference between the '946 application and the present application is that the '946 application emphasizes on SMO, while the present application emphasizes on SMLO.

Figure 4G:
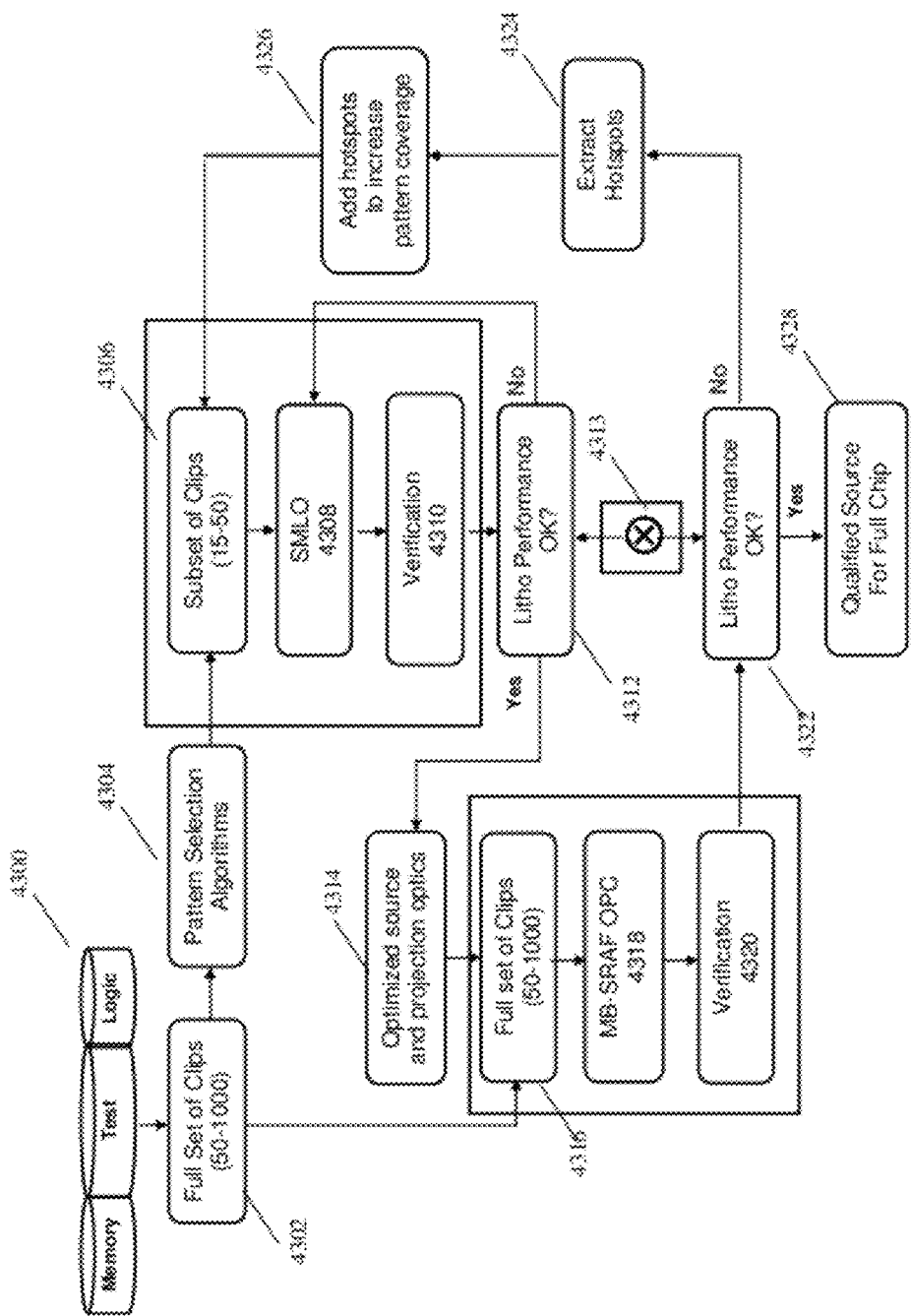

In FIG. 4G, a target design layout 4300 (typically comprising a layout in a standard digital format such as OASIS, GDSII, etc.) for which a lithographic process is to be optimized includes memory, test patterns and logic. From this design layout, a full set of clips 4302 is extracted, which represents all the complicated patterns in the design 4300 (typically about 50 to 1000 clips). As will be appreciated by those skilled in the art, these clips represent small portions (i.e. circuits, cells or patterns) of the design for which particular attention and/or verification is needed.

As generally shown in 4304, a small subset of clips 4306 (e.g. 15 to 50 clips) is selected from the full set 4302. As will be explained in more detail below, the selection of clips is preferably performed such that the process window of the selected patterns as closely as possible matches the process window for the full set of critical patterns. The effectiveness of the selection is also measured by the total turn run time (pattern selection and SMLO) reduction.

In 4308, SMLO is performed with the selected patterns (15 to 50 patterns) 4306. More particularly, an illumination source is optimized for the selected patterns 4306. This optimization can be performed using any of a wide variety of known methods, for example those described in U.S. Patent Pub. No. 2004/0265707, the contents of which are incorporated herein by reference.

In 4310, manufacturability verification of the selected patterns 4306 is performed with the source and projection optics obtained in 4308. More particularly, verification includes performing an aerial image simulation of the selected patterns 4306 and the optimized source and projection optics and verifying that the patterns will print across a sufficiently wide process window. This verification can be performed using any of a wide variety of known methods, for example those described in U.S. Pat. No. 7,342,646, the contents of which are incorporated herein by reference.

If the verification in 4310 is satisfactory, as determined in 4312, then processing advances to full chip optimization in 4314. Otherwise, processing returns to 4308, where SMLO is performed again but with a different source or set of patterns. For example, the process performance as estimated by the verification tool can be compared against thresholds for certain process window parameters such as exposure latitude and depth of focus. These thresholds can be predetermined or set by a user.

In 4316, after the selected patterns meet lithography performance specifications as determined in 4312, the optimized source and projection optics 4314 will be used for optimization of the full set of clips or even for the actual full chip or full target design layout which has been represented by the set of clips and which is to be patterned on the substrate.

In 4318, model-based sub-resolution assist feature placement (MB-SRAF) and optical proximity correction (OPC) for all the patterns in the full set of clips 4316 or for the full chip or full target design layout is performed. This process can be performed using any of a wide variety of known methods, for example those described in U.S. Pat. Nos. 5,663,893, 5,821,014, 6,541,167 and 6,670,081.

In 4320, using processes similar to step 4310, full pattern simulation based manufacturability verification is performed with the optimized source and projection optics 4314 and the full set of clips 4316 or the full chip as corrected in 4318.

In 4322, the performance (e.g. process window parameters such as exposure latitude and depth of focus) of the full set of clips 4316 or the full chip or full target design layout is compared (as indicated by block 4313) against the subset of clips 4306. In one example embodiment, the pattern selection is considered complete and/or the source and projection optics are fully qualified for the full chip when the similar (<10%) lithography performances are obtained for both selected patterns (15 to 20) 4306 and all critical patterns (50 to 1000) 4316.

Otherwise, in 4324, hotspots are extracted, and in 4326 these hotspots are added to the subset 4306, and the process starts over. For example, hotspots (i.e. features among the full set of clips 4316 that limit process window performance) identified during verification 4320 are used for further source tuning or to re-run SMLO. The source and projection optics are considered fully converged when the process window of the full set of clips 4316 are the same between the last run and the run before the last run of 4322.

Therefore, from the above non-limiting examples, the reader should appreciate that SMLO is readily accommodated within the existing optimization framework in various forms.

As discussed before, optimization of the cost function (CF) is at the center of the SMLO method. CF can be an RMS value of some lithographic metric. Of course, $CF(z_1,$ $z_2, \ldots, z_N$) is not limited to RMS of $f_p(z_1, z_2, \ldots, z_N)$. $CF(z_1, z_2, \ldots, z_N)$ can be in any other suitable form.

Figure 5:
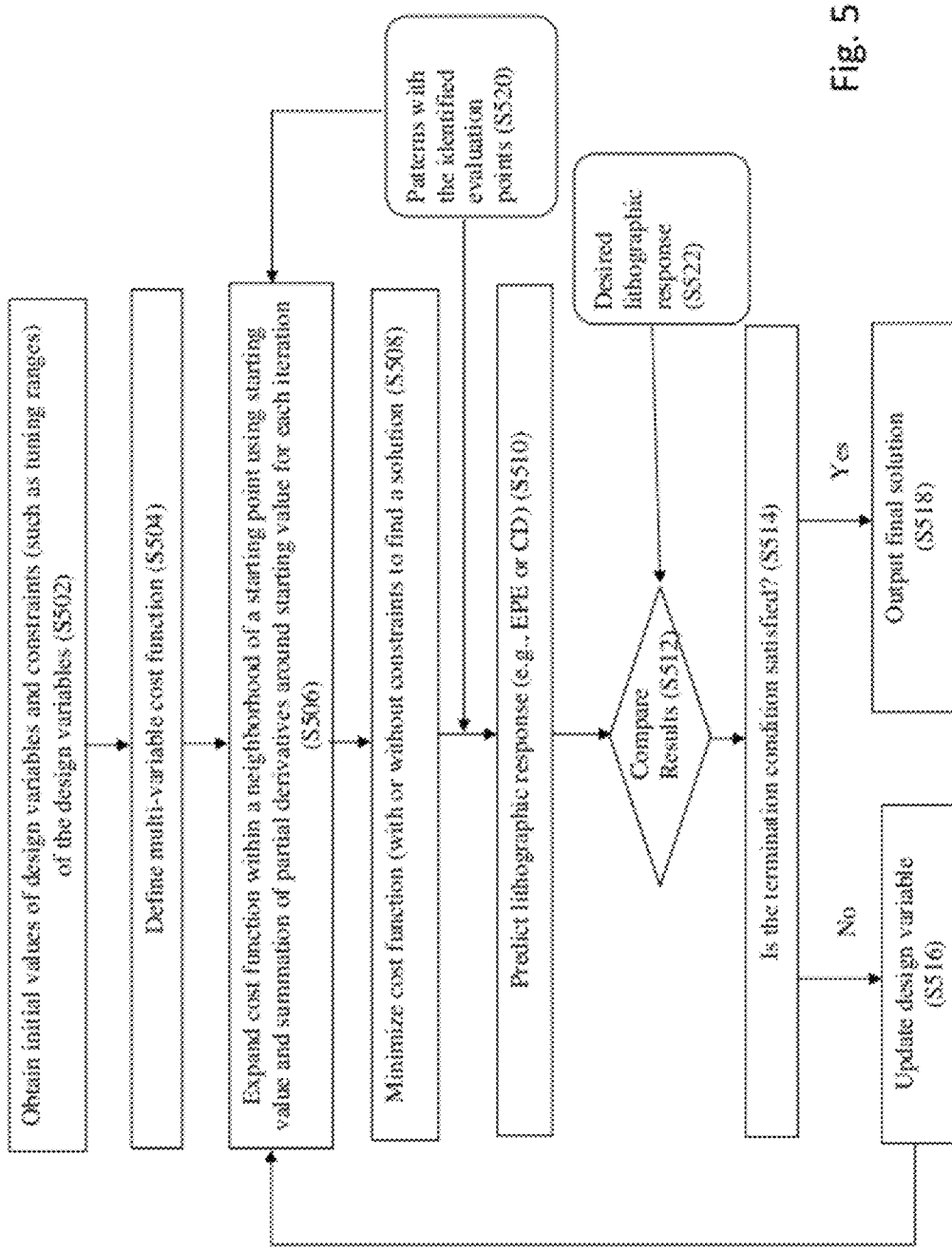
FIGS. 5-7 show example flowcharts of various optimization processes, according to embodiments of the present invention.

FIG. 5 shows one exemplary method of optimization, where a cost function is minimized. In step 502, initial values of design variables are obtained, including their tuning ranges, if any. In step S504, the multi-variable cost function is set up. In step S506, the cost function is expanded within a small enough neighborhood around the starting point value of the design variables for the first iterative step (i=0). In step S508, standard multi-variable optimization techniques are applied to minimize the cost function. Note that the optimization problem can apply constraints, such as tuning ranges, during the optimization process in S508 or at a later stage in the optimization process. Step S520 indicates that each iteration is done for the given test patterns (also known as "gauges") for the identified evaluation points that have been selected to optimize the lithographic process. In step S510, a lithographic response is predicted. In step S512, the result of step S510 is compared with a desired or ideal lithographic response value obtained in step S522. If the termination condition is satisfied in step S514, i.e. the optimization generates a lithographic response value sufficiently close to the desired value, and then the final value of the design variables is outputted in step S518. The output step may also include outputting other functions using the final values of the design variables, such as outputting an wavefront aberration-adjusted map at the pupil plane (or other planes), an optimized source map, and optimized design layout etc. If the termination condition is not satisfied, then in step S516, the values of the design variables is updated with the result of the i-th iteration, and the process goes back to step S506.

Figure 6:
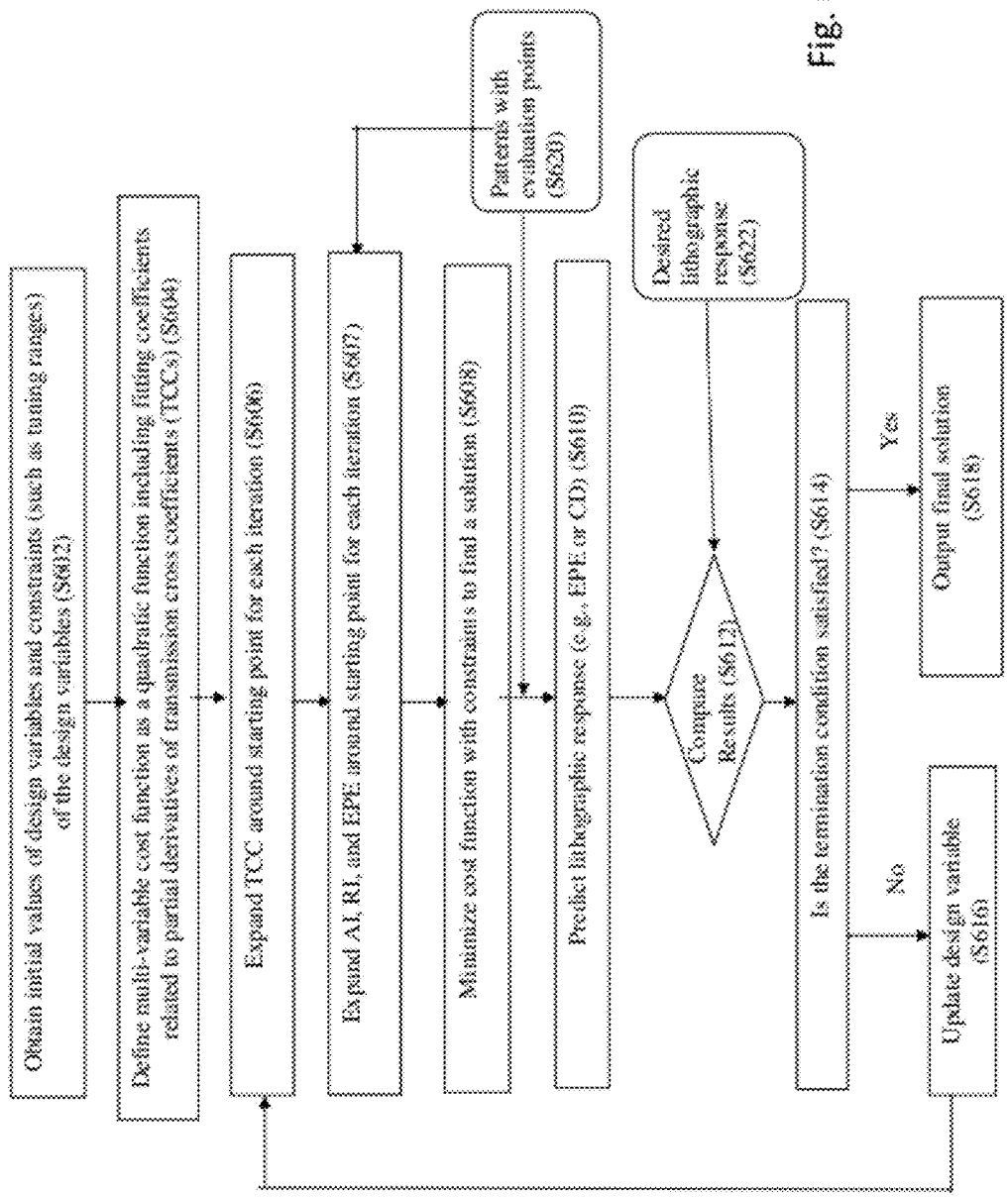

FIG. 6 shows an example flow diagram illustrating key steps of the second optimization process. Many of the steps of FIG. 6 are very similar to corresponding steps in FIG. 5, unless explained otherwise here. One major difference is that in step S604, the multi-variable cost function is expressed as a higher-order (such as quadratic) polynomial including fitting coefficients related to, for example, partial derivatives of transmission cross coefficients (TCCs). In step S606 TCC is expanded around starting point for each iteration, and in step S607, aerial image, resist image and edge placement error (EPE) are expanded. The rest of the steps are similar to the corresponding steps described in FIG. 5. From the elucidation above it will be apparent to the skilled person that in a specific embodiment of the invention, the number of iterations may even be one, resulting in a single calculation sequence. This may, for example, occur when the description of some design variables initially is sufficient enough that the predefined termination condition is satisfied after the single calculation.

A method of maximizing the process window according to an embodiment, thus comprises finding values of the design variables that minimize the maximum value of the probability that the resist image (e.g., solubility of the resist in the resist layer) at any evaluation point p ($RI_p$) falls out of a permitted range.

Figure 7:
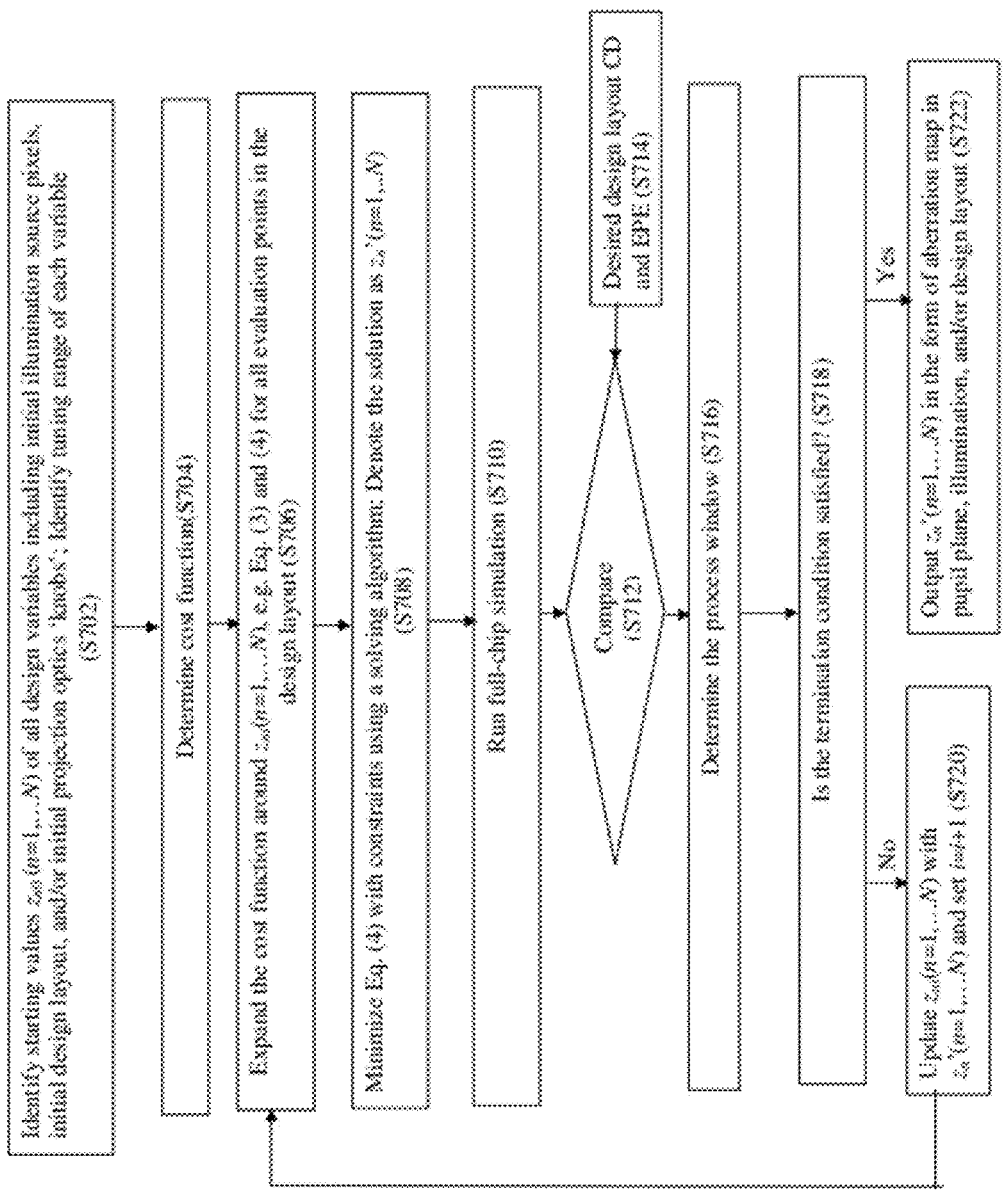

FIG. 7 shows one specific example of how a simultaneous SMLO process can use a Gauss Newton Algorithm for optimization. In step S702, starting values of design variables are identified. Tuning ranges for each variable may also be identified. In step S704, the cost function is defined using the design variables. In step S706 cost function is expanded around the starting values for all evaluation points in the design layout. In optional step S710, a full-chip simulation is executed to cover all critical patterns in a full-chip design layout. Desired lithographic response metric (such as CD or EPE) is obtained in step S714, and compared with predicted values of those quantities in step S712. In step S716, a process window is determined. Steps S718, S720, and S722 are similar to corresponding steps S514, S516 and S518, as described with respect to FIG. 5. As mentioned before, the final output may be a wavefront aberration map in the pupil plane, optimized to produce the desired imaging performance. The final output may also be an optimized source map and/or an optimized design layout.

Figure 8A:
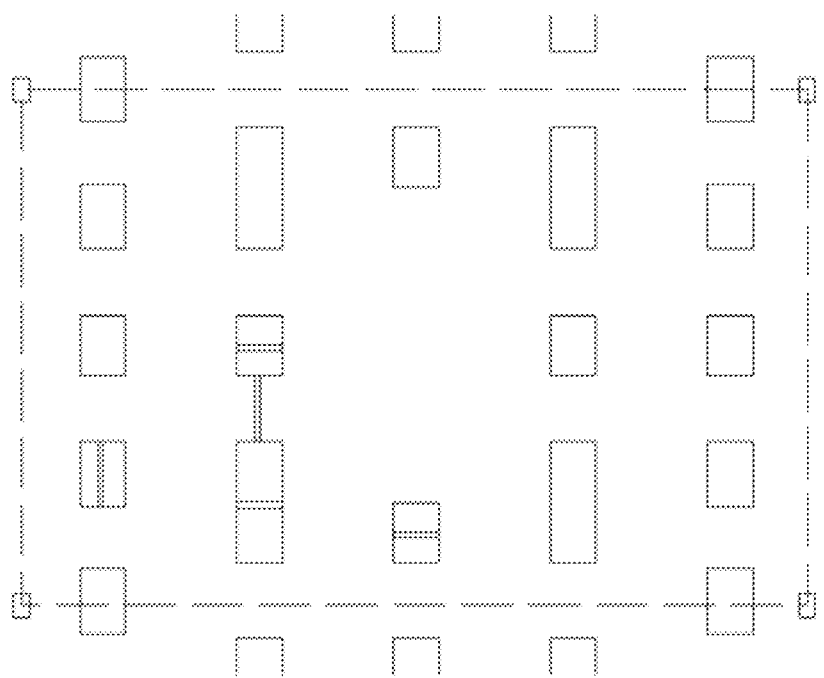
Figure 8C:
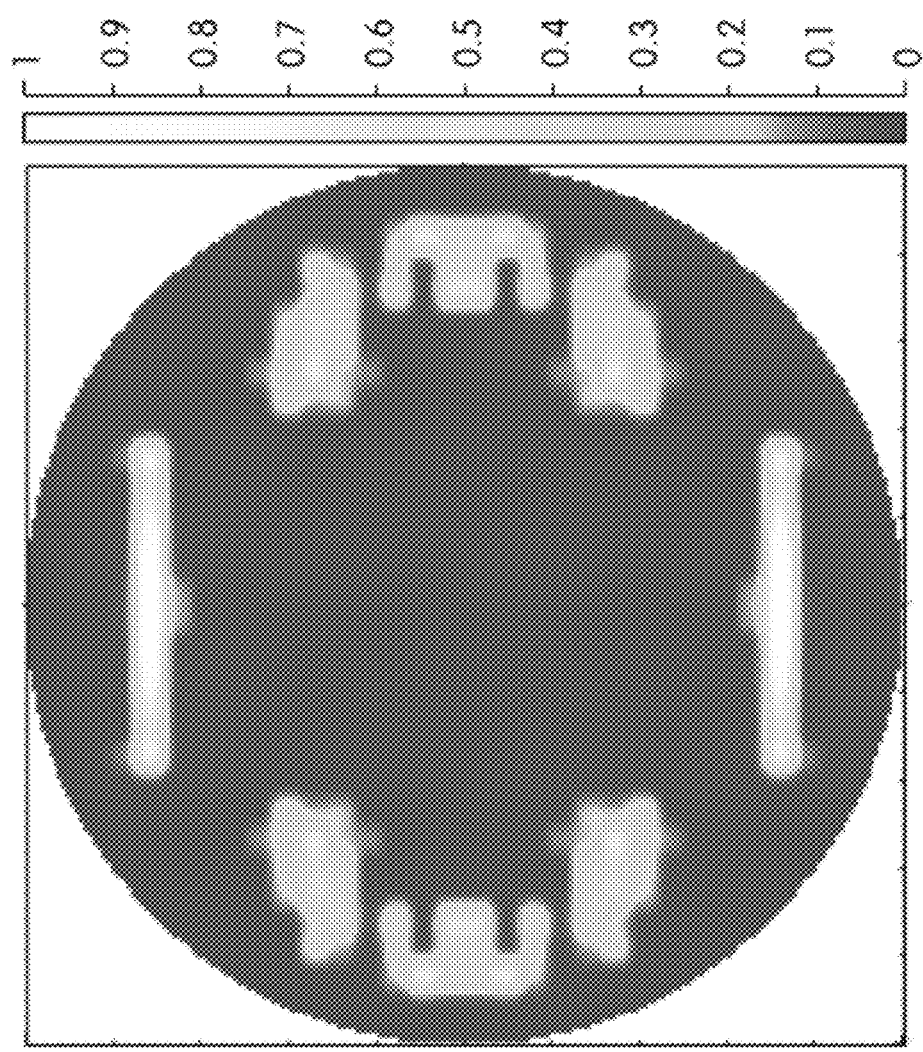

FIGS. 8A-8F show the Source-Mask-Lens optimization as shown in FIG. 4B applied to a portion of a design layout. In FIG. 8A the target design layout is shown. This target design layout may be provided in an electronic form such as a GDSII or Oasis design format and may be one of the patterns in the subset of patterns. In the current example, the target design layout is a single pattern, for example from the subset of pattern of the portion of the design. Alternatively, the target pattern may comprise all selected patterns from the subset of patterns to achieve a good coverage of the portion of the design layout which is to be imaged on the substrate. Note that the subset of patterns may encompass all patterns in a full chip design layout. The target pattern or the selected pattern from the subset of patterns may comprise hot spots, warm spots, clips and even may comprise manually or automatically extracted patterns from the portion of the design layout. The initial source in this example is a well-known annular illumination source and has not been shown in any of the drawings. This target design as shown in FIG. 8A together with the initial source is subsequently used in the simultaneous optimization of the source and target pattern, also commonly referred to as Source-Mask-Optimization or SMO. In the SMO also Sub-Resolution Assist Features or SRAFs 810 are added as can be seen in the optimized target design of FIG. 8B. The SMO process also proposes a change to the source or illumination pupil which can be seen in FIG. 8C. The legend in FIG. 8C shows intensity value in an arbitrary relative scale. Next the optimized source pupil as shown in FIG. 8C and the optimized target pattern as shown in FIG. 8B are kept fixed and the phase (i.e. lens) correction is applied. The phase correction is done by selectively repeating the steps of: defining a multi-variable cost function of a plurality of design variables that are characteristics of the lithographic process, in which at least some of the plurality of design variables of this cost function are characteristics of the projection optics; and, iteratively reconfiguring the plurality of design variables until a predefined termination condition is satisfied.

Figure 8D:
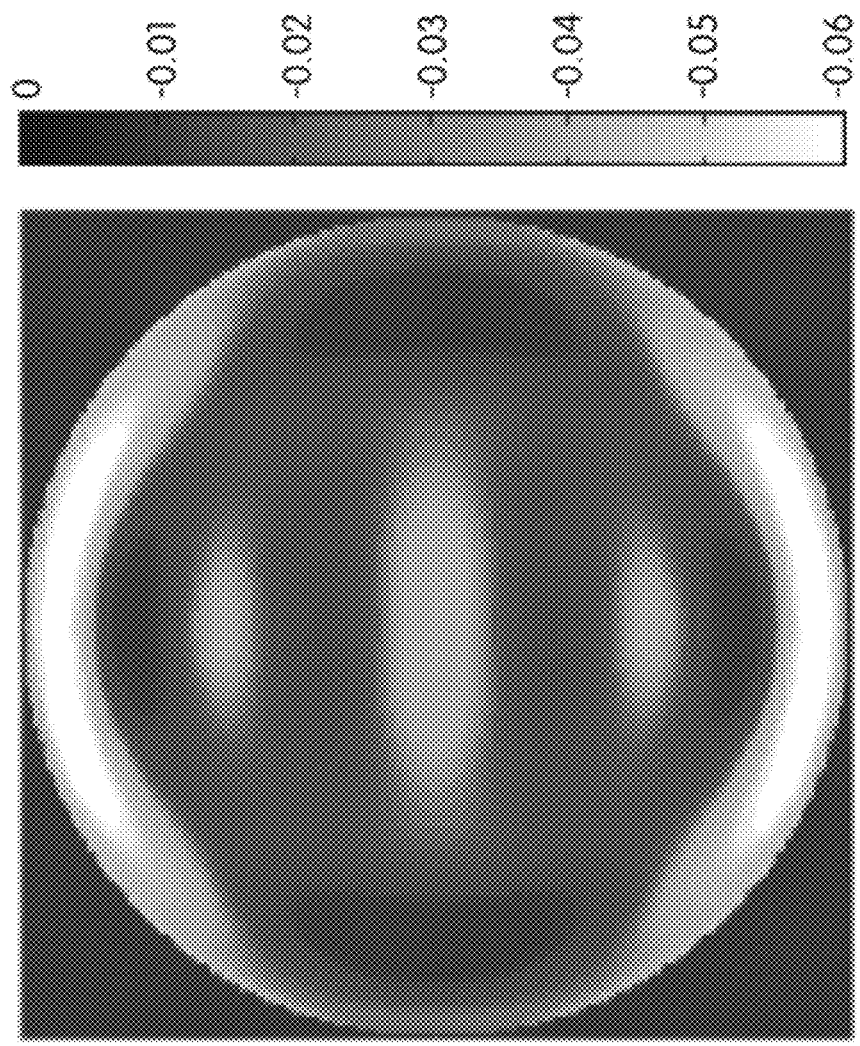
Figure 8E:
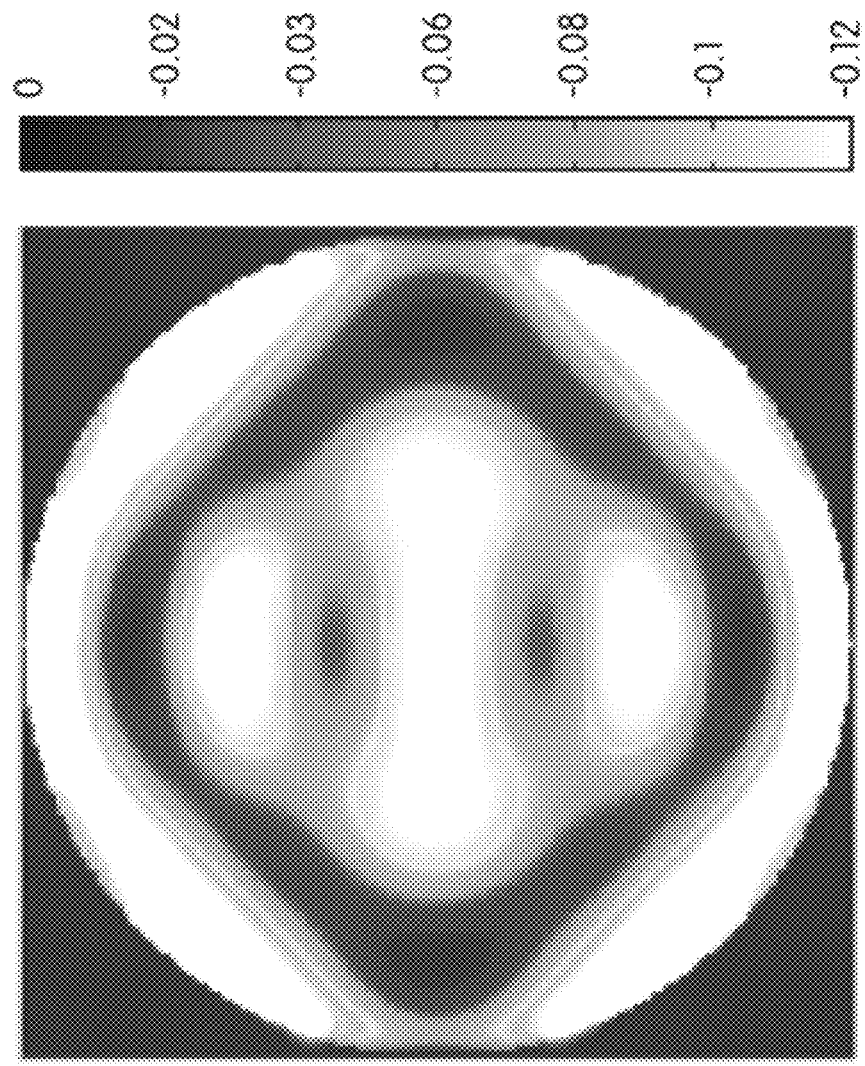

The phase correction step in the current example has been performed using two different termination conditions, resulting in two different embodiments for the pupil-plane correction in the projection lens. The first embodiment of the pupil-plane correction as shown in FIG. 8D results from using a minimized phase aberration in the pupil plane, and the second embodiment of the pupil-plane correction as shown in FIG. 8E results from minimizing CD errors on the gauges. Again, the respective legends in FIGS. 8D and 8E show intensity values in arbitrary relative scales.

Figure 8F:
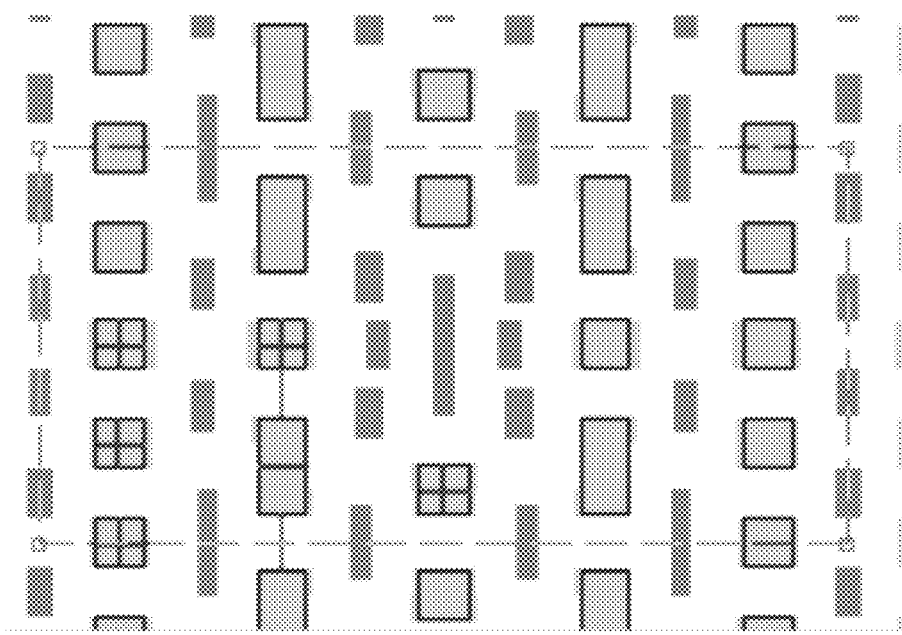

FIG. 8F shows a further adapted and further optimized target design layout which has been optimized using the optimized source (which has not been altered after the SMO process and still is represented by FIG. 8C) together with the most recently optimized phase corrections as shown in FIG. 8E. Comparing FIGS. 8B and 8E shows that a further improvement of the overall process window may be achieved when the optimized phase corrections are used to generate the further optimized target layout. In this procedure, and as indicated in FIG. 4B (see step 4050) this sequential optimization of the phase corrections (step 4060 in FIG. 4B) and target pattern (step 4070 in FIG. 4B) may continue until a predefined termination condition is achieved.

Figure 9:
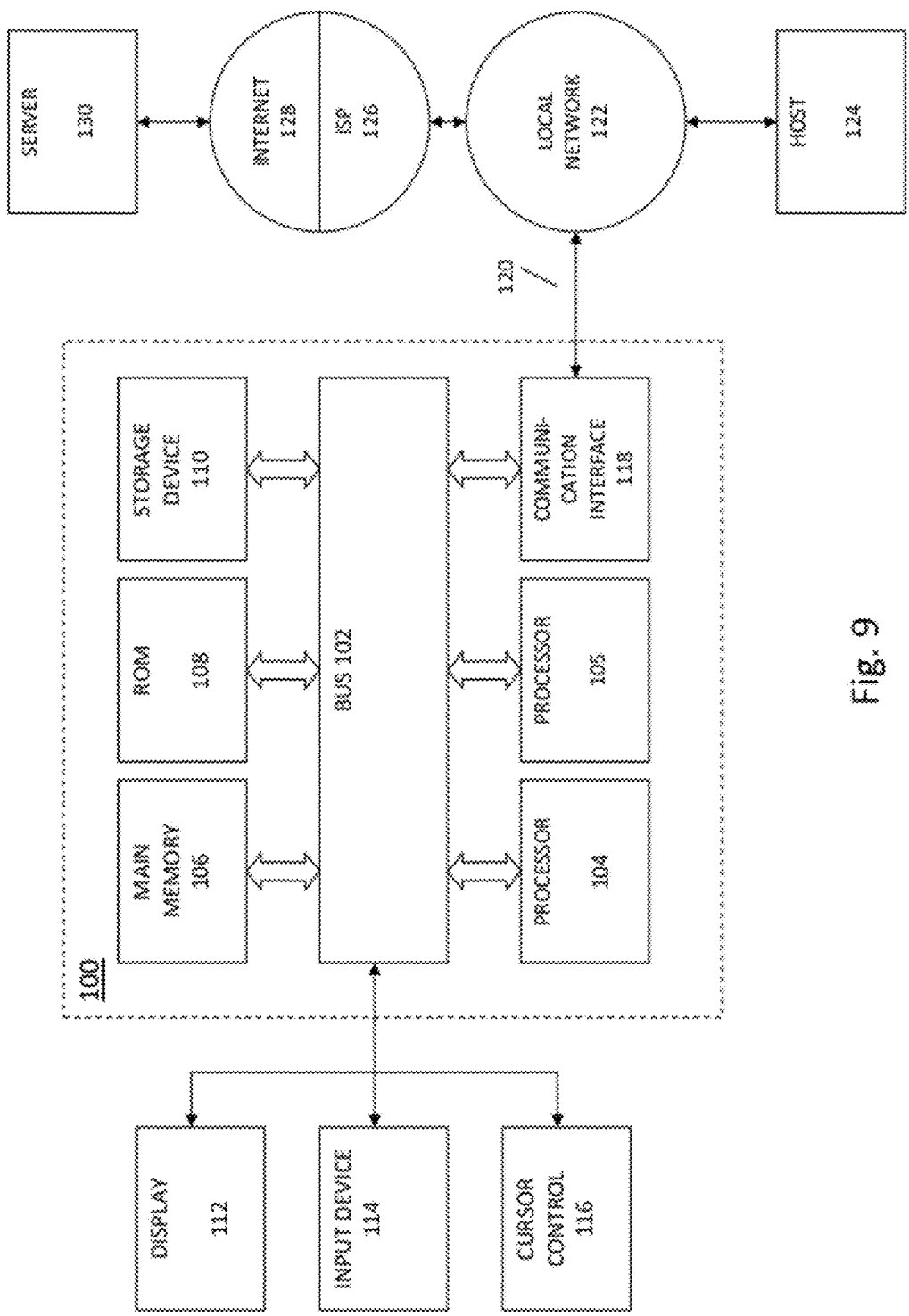
FIG. 9 is a block diagram of an example computer system in which embodiments of the invention can be implemented.

FIG. 9 is a block diagram that illustrates a computer system 100 which can assist in implementing the optimization methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, portions of the optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 10:
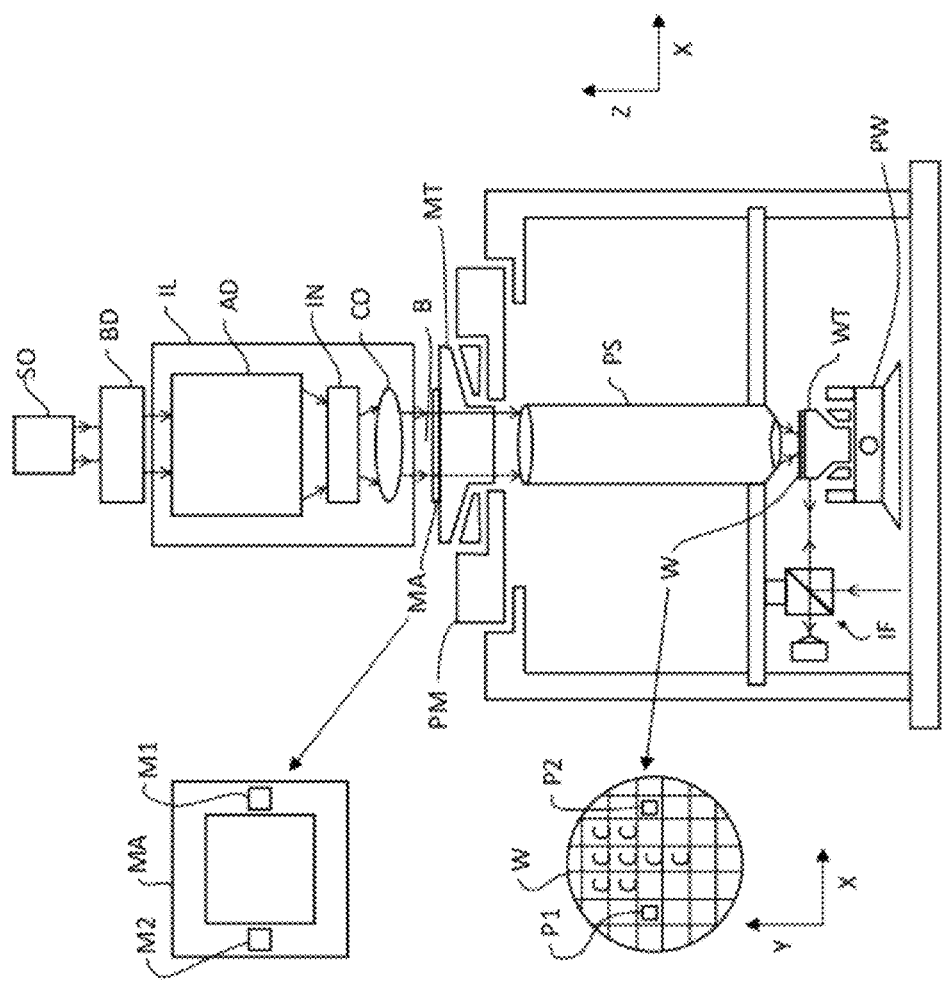
FIG. 10 is a schematic diagram of a lithographic projection apparatus to which embodiments of the invention are applicable.

FIG. 10 schematically depicts an exemplary lithographic projection apparatus whose illumination source could be optimized utilizing the methods described herein. The apparatus comprises:

- a radiation system IL, for supplying a projection beam B of radiation. In this particular case, the radiation system also comprises a radiation source SO;
- a first object table (mask table) MT provided with a mask holder for holding a mask MA (e.g., a reticle), and connected to first positioning means for accurately positioning the mask with respect to item PS;
- a second object table (substrate table) WT provided with a substrate holder for holding a substrate W (e.g., a resist-coated silicon wafer), and connected to second positioning means for accurately positioning the substrate with respect to item PS;
- a projection system ("lens") PS (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source SO (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the mask MA has a desired uniformity and intensity distribution in its cross-section.

It should be noted with regard to FIG. 10 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the mask MA, which is held on a mask table MT. Having traversed the mask MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam B. Similarly, the first positioning means can be used to accurately position the mask MA with respect to the path of the beam B, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 10. However, in the case of a wafer stepper (as opposed to a step-and-scan tool) the mask table MT may just be connected to a short stroke actuator, or may be fixed.

The depicted tool can be used in two different modes:

- In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;
- In scan mode, essentially the same scenario applies, except that a given target portion C is not exposed in a single "flash". Instead, the mask table MT is movable in a given direction (the so-called "scan direction", e.g., the y direction) with a speed v, so that the projection beam B is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

The invention may further be described using the following clauses:

1. A computer-implemented method for improving a lithographic process for imaging a portion of a design layout onto a substrate using a lithographic projection apparatus comprising an illumination source and projection optics, the method comprising:
    selecting a subset of patterns from the portion of the design layout and selecting an initial illumination source;
    simultaneously optimizing the subset of patterns and the illumination source; and
    optimizing characteristics of the projection optics by using the optimized illumination source.
2. The method of clause 1, wherein the step of simultaneously optimizing the subset of patterns and the illumination source is performed by selectively repeating the steps of:
    defining a first multi-variable cost function of a first plurality of design variables that are characteristics of the lithographic process, at least some of the first plurality of design variables being characteristics of the illumination source and of the subset of patterns;
    iteratively reconfiguring the first plurality of design variables until a first predefined termination condition is satisfied.
3. The method of clause 1, wherein the step of optimizing characteristics of the projection optics is performed by selectively repeating the steps of:
    defining a second multi-variable cost function of a second plurality of design variables that are characteristics of the lithographic process, at least some of the second plurality of design variables of the second cost function being characteristics of the projection optics; and iteratively reconfiguring the second plurality of design variables until a second predefined termination condition is satisfied.

4. The method of clause 1, wherein the portion of the design layout comprises one or more of the following: an entire design layout, a clip, a section of a design layout that is known to have one or more critical features, a section of the design layout where a hot spot or a warm spot has been identified from a full-chip simulation, and a section of the design layout where one or more critical features have been identified by a pattern selection method.

5. The method of clause 2 or 3, wherein the first and/or second predefined termination condition includes one or more of: minimization of the cost function; maximization of the cost function; reaching a preset number of iterations; reaching a value of the cost function equal to or beyond a preset threshold value; reaching a predefined computation time; reaching a predefined process window; and, reaching a value of the cost function within an acceptable error limit.

6. The method of clause 1, wherein the method further comprises a step of:
using the optimized illumination source and the optimized projection optics for further optimizing the subset of patterns.

7. The method of clause 6, wherein the step of using the optimized illumination source and the optimized projection optics for further optimizing the subset of patterns is performed by selectively repeating the steps of:
defining a third multi-variable cost function of a third plurality of design variables that are characteristics of the lithographic process, at least some of the third plurality of design variables of the third cost function being characteristics of the subset of patterns; and
iteratively reconfiguring the third plurality of design variables until a third predefined termination condition is satisfied 8. The method of clause 6, wherein the step of optimizing the subset of patterns while using the previously optimized projection optics and the optimized illumination source and the step of optimizing the projection optics while using the previously optimized subset of patterns and the optimized illumination source is performed iteratively until a fourth predefined termination condition is satisfied.

9. The method of clause 3, wherein the second plurality of design variables of the second cost function comprise characteristics of both the projection optics and of the subset of patterns.

10. A computer-implemented method for improving a lithographic process for imaging a portion of a design layout onto a substrate using a lithographic projection apparatus comprising an illumination source and projection optics, the method comprising:
selecting a subset of patterns from the portion of the design layout and selecting an initial illumination source;
simultaneously optimizing the subset of patterns, the illumination source and the projection optics.

11. The method of clause 10, wherein the step of simultaneously optimizing the subset of patterns, the illumination source and the projection optics is performed by selectively repeating the steps of:
defining a multi-variable cost function of a plurality of design variables that are characteristics of the lithographic process, at least some of the plurality of design variables being characteristics of the illumination source and of the subset of patterns and of the projection optics;
iteratively reconfiguring the plurality of design variables until a predefined termination condition is satisfied.

12. The method of clause 10, wherein the method comprises a further step of tuning the subset of patterns and/or tuning the projection optics.

13. The method of clause 12, wherein the step of tuning the subset of patterns and/or tuning the projection optics is performed by selectively repeating the steps of:
defining a further multi-variable cost function of a further plurality of design variables that are characteristics of the lithographic process, at least some of the further plurality of design variables being characteristics of the subset of patterns and/or at least some of the further plurality of design variables being characteristics of the projection optics;
iteratively reconfiguring the set of further design variables until a further predefined termination condition is satisfied.

14. The method of clause 2, 3, 7, 11 or 13, wherein at least one of the iterative reconfiguration steps is performed without constraints or with constraints dictating the range of at least some of the design variables.

15. The method of clause 14, wherein at least some of the design variables are under constraints representing physical restrictions in a hardware implementation of the lithographic projection apparatus.

16. The method of clause 15, wherein the constraints include one or more of: tuning ranges, rules governing mask manufacturability, and interdependence between the design variables.

17. The method of clause 2, 3, 7, 11 or 13, wherein the cost function is a function of one or more of the following lithographic metrics: edge placement error, critical dimension, resist contour distance, worst defect size, and best focus shift.

18. The method of clause 1 or 10, wherein the method comprises, prior to performing the steps of the optimization process, selecting a subset of target patterns that characteristically represents features of the portion of the design layout.

19. The method of clause 2, 3, 7, 11 or 13, wherein the optimization process includes iteratively minimizing the cost function by calculating linear fitting coefficients within predefined relatively small neighborhoods around a starting point in each iteration.

20. The method of clause 19, wherein the cost function is minimized by a method selected from a group consisting of the Gauss-Newton algorithm, the Levenberg-Marquardt algorithm, the gradient descent algorithm, simulated annealing, and the genetic algorithm.

21. The method of clause 2, 3, 7, 11 or 13, wherein the cost function is minimized by solving polynomials, including higher-order polynomials of the design variables.

22. The method of clause 21, wherein the cost function is expanded in terms fitting constant coefficients.

23. The method of clause 22, wherein the fitting constant coefficients are computed from coefficients from polynomial expansion of transmission cross coefficients (TCCs).

24. The method of clause 23, comprising computing partial derivatives of the transmission cross coefficients.

25. The method of clause 24, wherein the partial derivatives of the transmission cross coefficients are computed from impulse response of the design variables.

26. The method of clause 2, 3, 7, 11 or 13, wherein the cost function comprises characteristics of a resist image or an aerial image.

27. The method of clause 2, 3, 7, 11 or 13, wherein the cost function is minimized by solving a quadratic programming problem.

28. The method of clause 2, 3, 7, 11 or 13, wherein the cost function is a function of only the design variables that are characteristics of the projection optics, while the other design variables are assigned predefined values.

29. The method of clause 2, 3, 7, 11 or 13, wherein the cost function represents a probability of finding a hot spot in the portion of the design layout.

30. A computer program product comprising a computer readable medium having instructions recorded thereon, the instructions when executed by a computer implementing the method of any of the above claims.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made to the embodiments as described without departing from the scope of the claims set out below.

What is claimed is:

1. A method of improving a lithographic process for imaging a portion of a design layout onto a substrate using a lithographic projection apparatus comprising projection optics, the method comprising:

selecting a subset of patterns from the portion of the design layout and selecting an initial illumination source;

simultaneously optimizing, by a hardware computer system, the subset of patterns and the illumination source; and optimizing, by the hardware computer system, a characteristic of the projection optics used to project the subset of patterns onto a radiation-sensitive substrate by using at least the optimized illumination source, wherein optimizing the characteristic of the projection optics comprises determining a phase shift to be introduced in the projection optics with respect to a phase of the optimized illumination source.

2. The method of claim 1, wherein simultaneously optimizing the subset of patterns and the illumination source is performed by selectively repeating:

evaluating a first multi-variable cost function of a first plurality of design variables that are characteristics of the lithographic process, at least some of the first plurality of design variables being a characteristic of the illumination source and a characteristic of the subset of patterns; and reconfiguring the first plurality of design variables until a first predefined termination condition is satisfied.

3. The method of claim 2, wherein the first predefined termination condition includes one or more selected from: minimization of the cost function; maximization of the cost function; reaching a preset number of iterations; reaching a value of the cost function equal to or beyond a preset threshold value; reaching a predefined computation time; reaching a predefined process window; and, reaching a value of the cost function within an acceptable error limit.

4. The method of claim 2, wherein at least one of the iterative reconfigurations is performed with a constraint dictating the range of at least some of the design variables.

5. The method of claim 4, wherein at least some of the design variables are under constraints representing physical restrictions in a hardware implementation of the lithographic projection apparatus.

6. The method of claim 5, wherein the constraints include one or more selected from: a tuning range, a rule governing mask manufacturability, and/or an interdependence between the design variables.

7. The method of claim 2, wherein the cost function is a function of one or more selected from: edge placement error, critical dimension, resist contour distance, worst defect size, and/or best focus shift.

8. The method of claim 2, wherein the cost function is minimized by solving polynomials, including higher-order polynomials of the design variables.

9. The method of claim 8, wherein the cost function is expanded in terms including fitting constant coefficients.

10. The method of claim 9, wherein the fitting constant coefficients are computed from coefficients from polynomial expansion of transmission cross coefficients (TCCs).

11. The method of claim 2, wherein the cost function comprises a characteristic of a resist image or of an aerial image.

12. The method of claim 2, wherein the cost function represents a probability of finding a hot spot in the portion of the design layout.

13. The method of claim 1, wherein optimizing a characteristic of the projection optics is performed by selectively repeating:

evaluating a second multi-variable cost function of a second plurality of design variables that are characteristics of the lithographic process, at least one of the second plurality of design variables of the second cost function being a characteristic of the projection optics; and reconfiguring the second plurality of design variables until a second predefined termination condition is satisfied.

14. The method of claim 13, wherein the second plurality of design variables of the second cost function comprise a characteristic of the projection optics and a characteristic of the subset of patterns.

15. The method of claim 1, wherein the portion of the design layout comprises one or more selected from: an entire design layout, a clip, a section of a design layout that is known to have one or more critical features, a section of the design layout where a hot spot or a warm spot has been identified from a full-chip simulation, and/or a section of the design layout where one or more critical features have been identified by a pattern selection method.

16. The method of claim 1, further comprising using the optimized illumination source and the optimized projection optics for further optimizing the subset of patterns.

17. The method of claim 16, wherein using the optimized illumination source and the optimized projection optics for further optimizing the subset of patterns is performed by selectively repeating:

evaluating a third multi-variable cost function of a third plurality of design variables that are characteristics of the lithographic process, at least one of the third plurality of design variables of the third cost function being a characteristic of the subset of patterns; and reconfiguring the third plurality of design variables until a third predefined termination condition is satisfied.

18. The method of claim 16, wherein the optimizing the subset of patterns while using the previously optimized projection optics and the optimized illumination source and optimizing the projection optics while using the previously optimized subset of patterns and the optimized illumination source are performed iteratively until a fourth predefined termination condition is satisfied.

19. The method of claim 1, wherein the selecting the subset of target patterns comprises selecting a subset of patterns that characteristically represents features of the portion of the design layout.

20. A computer program product comprising a non-transitory computer readable medium having instructions recorded thereon, the instructions when executed by a computer implementing the method of claim 1.

21. The method of claim 1, wherein the characteristic of the projection optics includes an adjustable parameter for shaping a wavefront in the lithographic projection apparatus.

22. The method of claim 21, wherein the projection optics include a wavefront manipulator configured to adjust wavefront shape, intensity distribution of an irradiation beam of the illumination source, and/or phase shift of the irradiation beam of the illumination source.

* * * * *